(12) United States Patent
Maeda

(10) Patent No.: US 10,700,157 B2
(45) Date of Patent: Jun. 30, 2020

(54) DISPLAY DEVICE AND MANUFACTURING METHOD OF THE DISPLAY DEVICE

(71) Applicant: Japan Display Inc., Tokyo (JP)

(72) Inventor: Norihisa Maeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/989,278

(22) Filed: May 25, 2018

(65) Prior Publication Data

US 2018/0374914 A1   Dec. 27, 2018

(30) Foreign Application Priority Data

Jun. 27, 2017   (JP) ................. 2017-124697

(51) Int. Cl.
*H01L 27/32*   (2006.01)
*H01L 27/12*   (2006.01)
(Continued)

(52) U.S. Cl.
CPC ......... *H01L 27/3279* (2013.01); *G09G 3/006* (2013.01); *G09G 3/3233* (2013.01); *H01L 22/20* (2013.01); *H01L 27/124* (2013.01); *H01L 27/1248* (2013.01); *H01L 27/1255* (2013.01); *H01L 27/3258* (2013.01); *H01L 27/3262* (2013.01); *H01L 51/5206* (2013.01); *H01L 51/5221* (2013.01); *H01L 51/5228* (2013.01); *H01L 51/56* (2013.01); *G09G 2300/0426* (2013.01); *G09G 2300/0819* (2013.01); *G09G 2300/0852* (2013.01); *H01L 27/3248* (2013.01); *H01L 27/3265* (2013.01); *H01L 2227/323* (2013.01); *H01L 2251/558* (2013.01); *H01L 2251/566* (2013.01)

(58) Field of Classification Search
CPC ...... G06F 3/044; G06F 3/0412; G06F 3/0416; G06F 2203/04103; G02F 1/1368; G02F 2201/123; G02F 1/136286; G02F 1/13338; G02F 1/134309
USPC .......................................................... 257/40
See application file for complete search history.

(56) References Cited

U.S. PATENT DOCUMENTS

| 6,531,815 | B1 | 3/2003 | Okuyama et al. |
| 2003/0137325 | A1* | 7/2003 | Yamazaki ............. H01L 27/322 |
| | | | 327/80 |

(Continued)

FOREIGN PATENT DOCUMENTS

| JP | 2001-102169 A | 4/2001 |
| JP | 2009-117079 A | 5/2009 |

*Primary Examiner* — Jonathan Han
(74) *Attorney, Agent, or Firm* — Michael Best & Friedrich LLP

(57) ABSTRACT

Disclosed is a display device possessing: a plurality of pixels arranged in a matrix form over a substrate and each having a pixel electrode; a first wiring and a second wiring over the substrate and sandwiching the pixels; a first contact electrode and a second contact electrode respectively covering at least a part of the first wiring and at least a part of the second wiring; and an opposing electrode over and overlapping with the pixel electrodes, the first contact electrode, and the second contact electrode, the opposing electrode being shared by the plurality of pixels. The first wiring and the second wiring are spaced from each other and electrically connected to the opposing electrode through the first contact electrode and the second contact electrode, respectively.

16 Claims, 23 Drawing Sheets

(51) Int. Cl.
*H01L 51/52* (2006.01)
*H01L 51/56* (2006.01)
*H01L 21/66* (2006.01)
*G09G 3/00* (2006.01)
*G09G 3/3233* (2016.01)

(56) References Cited

U.S. PATENT DOCUMENTS

| | | | |
|---|---|---|---|
| 2009/0115321 A1 | 5/2009 | Hayashi | |
| 2010/0044690 A1* | 2/2010 | Okutani | H01L 27/3211 257/40 |
| 2010/0096633 A1* | 4/2010 | Hatano | H01L 27/1214 257/59 |
| 2011/0084267 A1* | 4/2011 | Yamazaki | H01L 29/42384 257/43 |

* cited by examiner

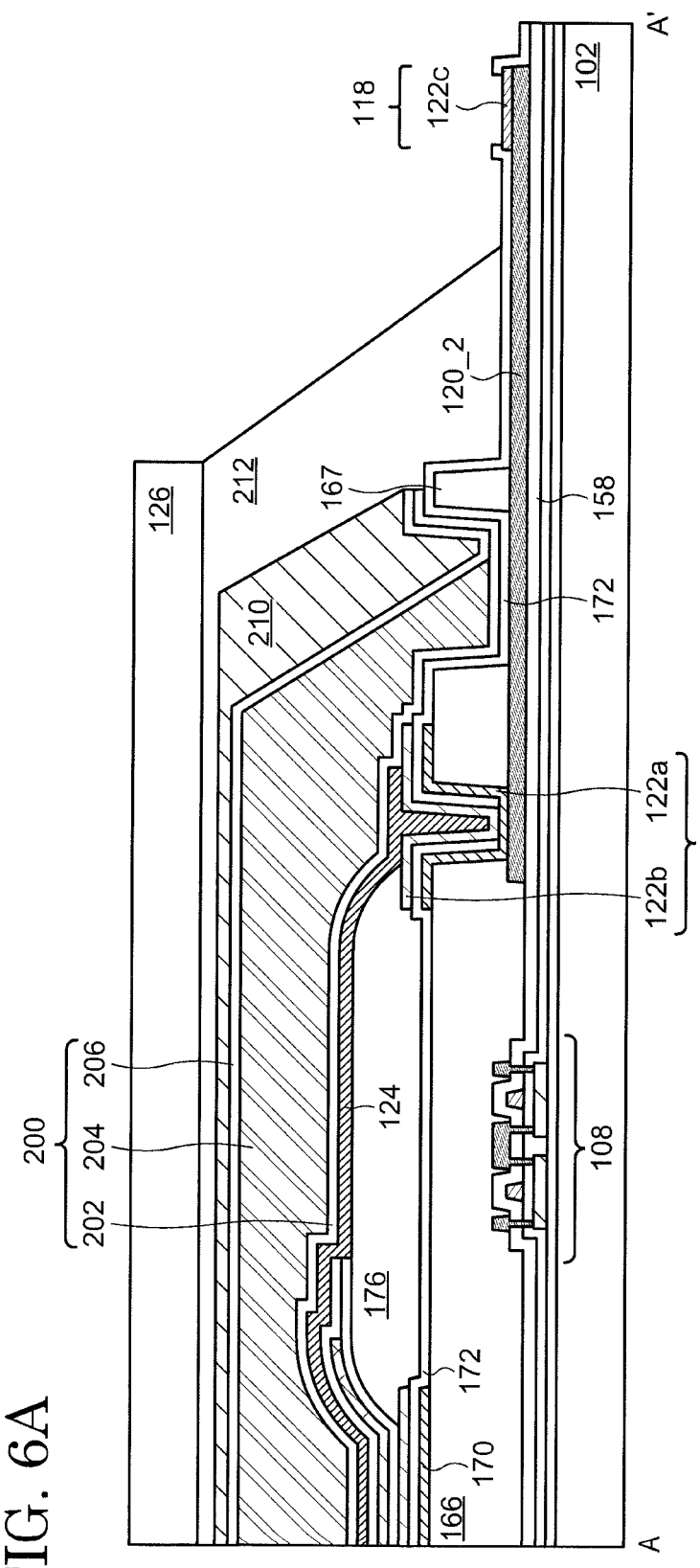
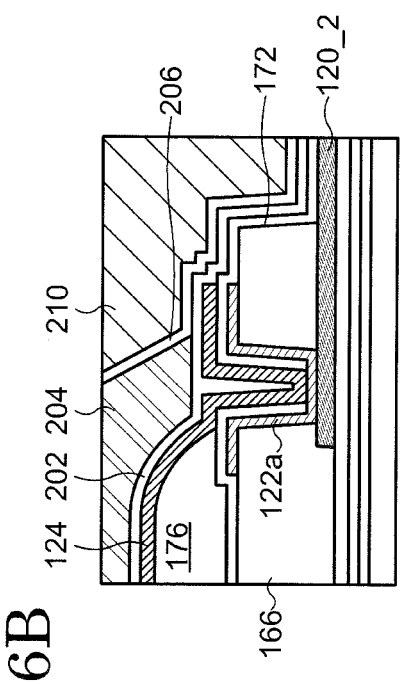
FIG. 6A
FIG. 6B

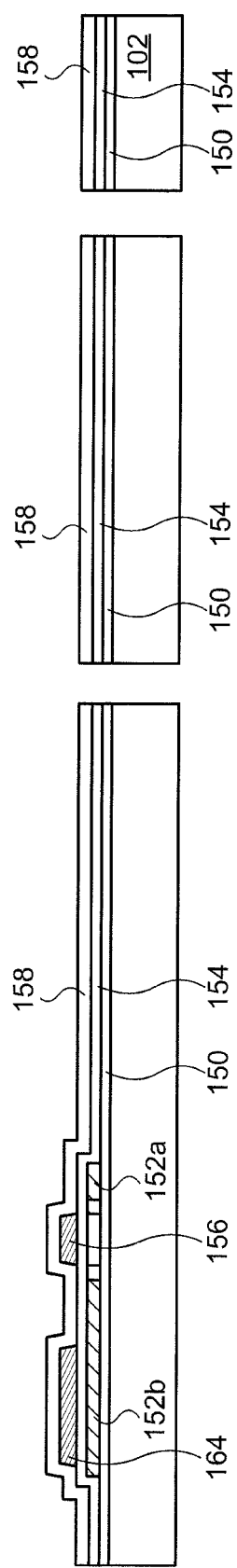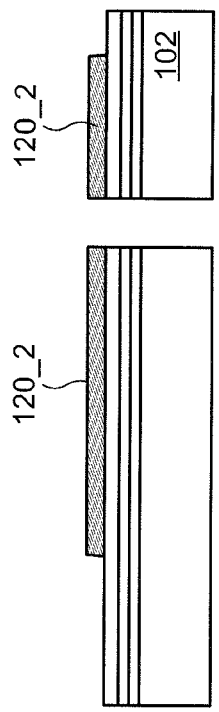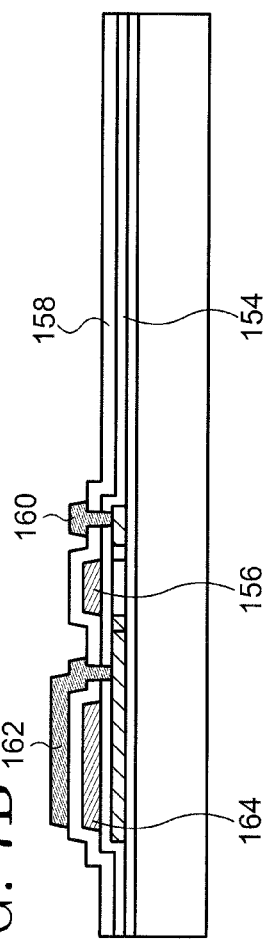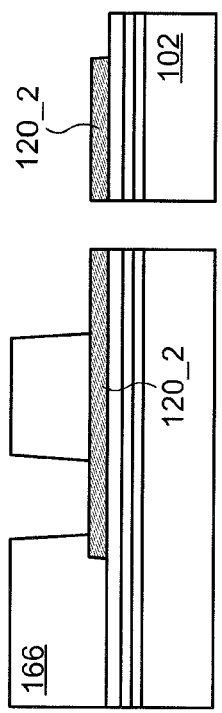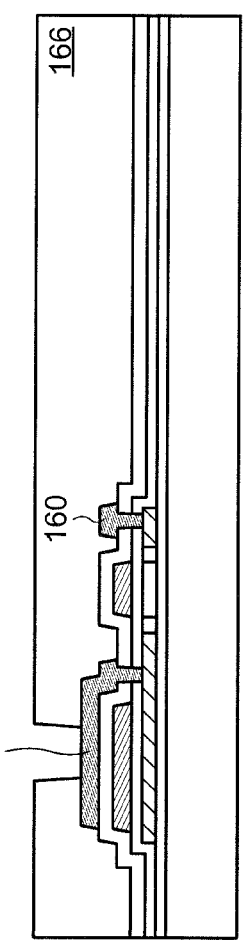
FIG. 7A
FIG. 7B
FIG. 7C

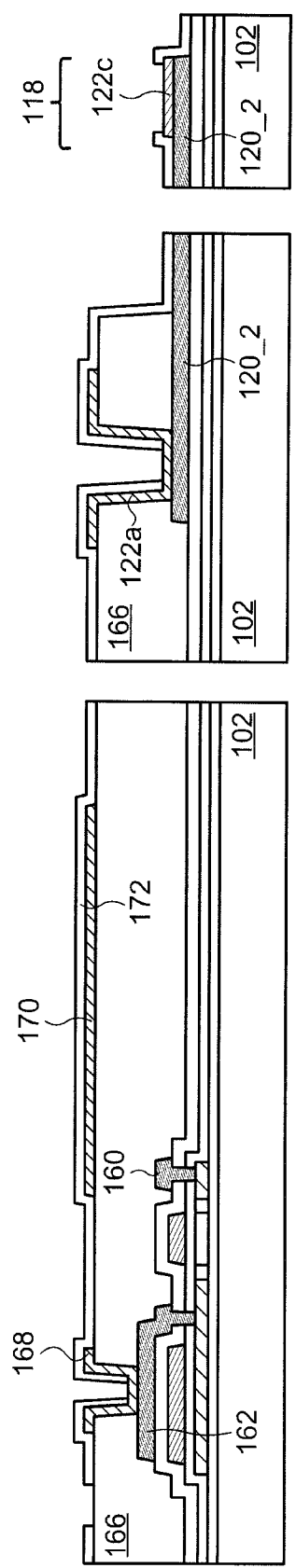
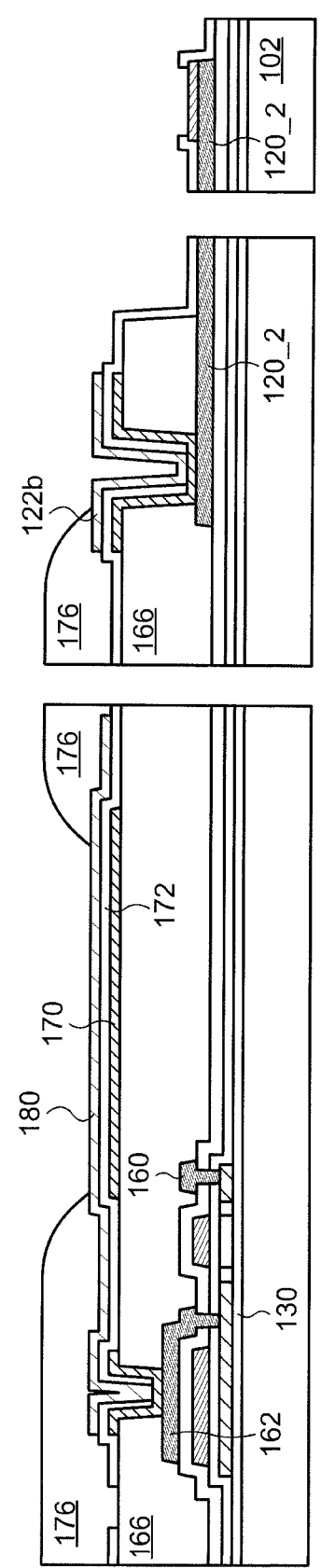
FIG. 8A
FIG. 8B

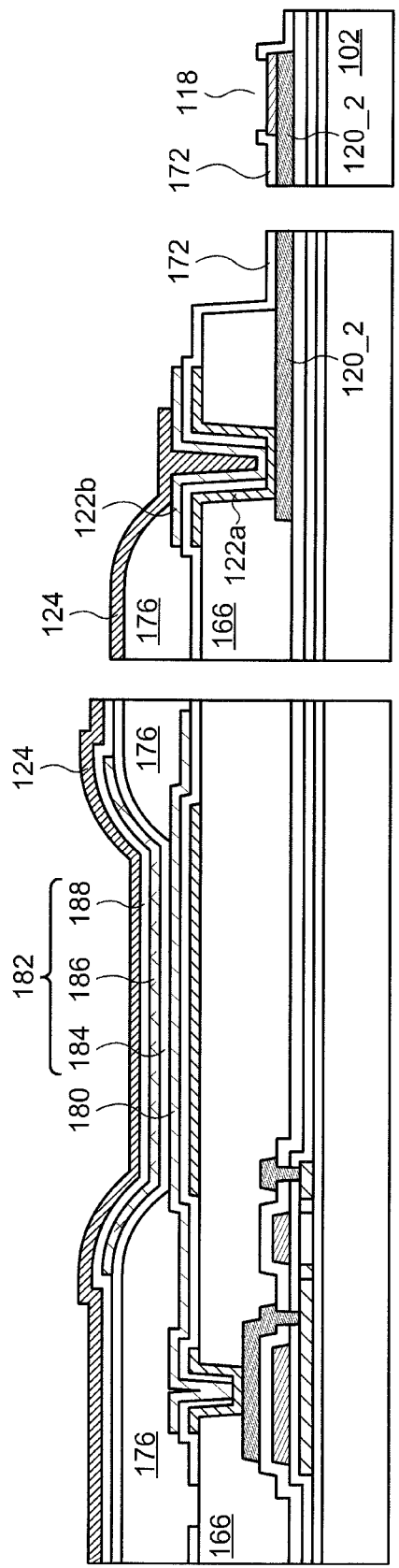
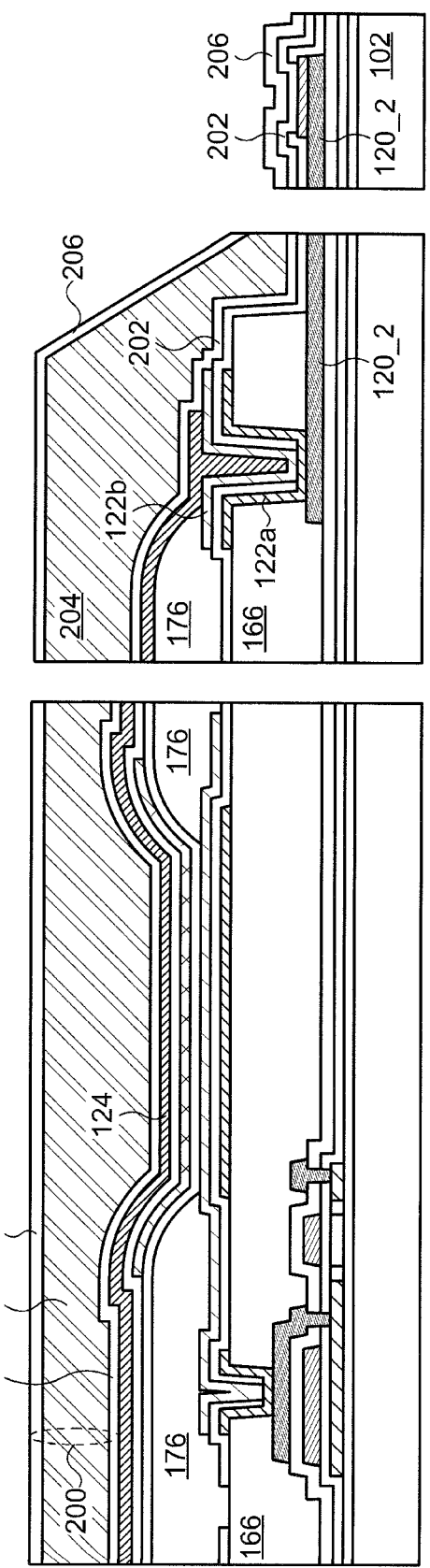
FIG. 9A
FIG. 9B

DISPLAY DEVICE AND MANUFACTURING METHOD OF THE DISPLAY DEVICE

CROSS REFERENCE TO RELATED APPLICATIONS

This application is based on and claims the benefit of priority from the prior Japanese Patent Application No. 2017-124697, filed on Jun. 27, 2017, the entire contents of which are incorporated herein by reference.

FIELD

The present invention relates to a display device and a manufacturing method thereof. For example, the present invention relates to a display device having an organic light-emitting element, a manufacturing method thereof, and a manufacture-managing method thereof.

BACKGROUND

An organic EL (Electroluminescence) display device is represented as an example of a display device. An organic EL display device has, as a display element, an organic light-emitting element (hereinafter, referred to as a light-emitting element) in each of a plurality of pixels formed over a substrate. A light-emitting element has a layer (hereinafter, referred to as an electroluminescence layer or an EL layer) including an emissive organic compound between a pair of electrodes (cathode and anode) and is operated by supplying current between the electrodes.

A light-emitting element is generally structured so that one of the pair of electrodes transmits visible light and the other reflects visible light. For example, an electrode including a conductive oxide such as indium-tin oxide (ITO) and indium-zinc oxide (IZO) or an electrode including a thin metal film with a thickness allowing visible light to pass therethrough is used as an electrode transmitting visible light. As disclosed in the Japanese Patent Application Publications No. 2001-102169 and 2009-117079, for instance, the use of such a light-transmitting electrode as an electrode (opposing electrode or upper electrode) positioned on an opposite side to a substrate enables production of a so-called top-emission type light-emitting element.

SUMMARY

An embodiment of the present invention is a display device. The display device possesses: a plurality of pixels arranged in a matrix form over a substrate and each having a pixel electrode; a first wiring and a second wiring over the substrate and sandwiching the plurality of pixels; a first contact electrode and a second contact electrode respectively covering at least a part of the first wiring and at least a part of the second wiring; and an opposing electrode over and overlapping with the pixel electrodes, the first contact electrode, and the second contact electrode, the opposing electrode being shared by the plurality of pixels. The first wiring and the second wiring are spaced from each other and electrically connected to the opposing electrode through the first contact electrode and the second contact electrode, respectively.

An embodiment of the present invention is a manufacturing method of a display device. The manufacturing method includes: forming, over a substrate, a first wiring and a second wiring spaced from each other; forming a first contact electrode and a second contact electrode respectively covering at least a part of the first wiring and at least a part of the second wiring; forming a pixel electrode over the substrate so as to be located between the first wiring and the second wiring; forming an EL layer over the pixel electrode; forming an opposing electrode over and overlapping with the first contact electrode, the second contact electrode, and the EL layer so as to be electrically connected to the first wiring and the second wiring through the first contact electrode and the second contact electrode, respectively; and measuring a resistance between the first wiring and the second wiring.

BRIEF DESCRIPTION OF DRAWINGS

FIG. 6A and FIG. 6B are schematic cross-sectional views of a display device according to an embodiment;

FIG. 7A to FIG. 7C are schematic cross-sectional views for explaining a manufacturing method of a display device according to an embodiment;

FIG. 8A and FIG. 8B are schematic cross-sectional views for explaining a manufacturing method of a display device according to an embodiment;

FIG. 9A and FIG. 9B are schematic cross-sectional views for explaining a manufacturing method of a display device according to an embodiment;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the present specification, when a plurality of structural elements similar to one another is discriminately indicated, the structural elements are expressed by using an underscore and a natural number after a reference number. When all of the structural elements are indicated or an arbitrarily selected multiple thereof is expressed indiscriminately, only a reference number is used.

First Embodiment

Figure 1:
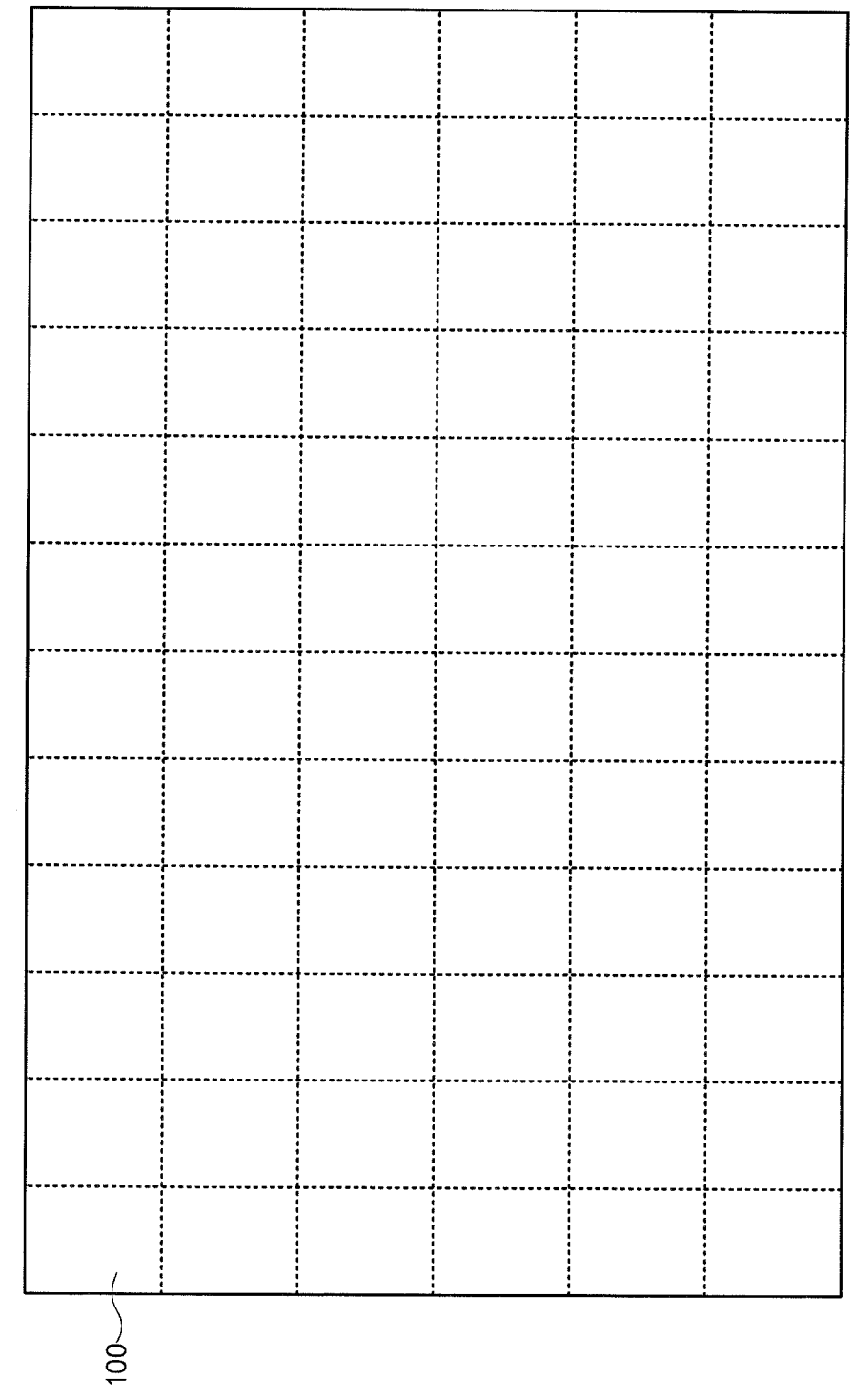
FIG. 1 is a schematic top view of a display device according to an embodiment.

In the present embodiment, a structure of a display device 100, a manufacturing method thereof, and a manufacture-managing method according to an embodiment of the present invention is explained.
1. Outline Structure As shown in FIG. 1, the display device 100 is manufactured by utilizing a large size substrate called a mother glass (MG). A plurality of display devices 100 is fabricated over one mother glass, and then the mother glass is divided into individual substrates 102 in a state where display elements, circuits, and the like are formed.

Figure 2:
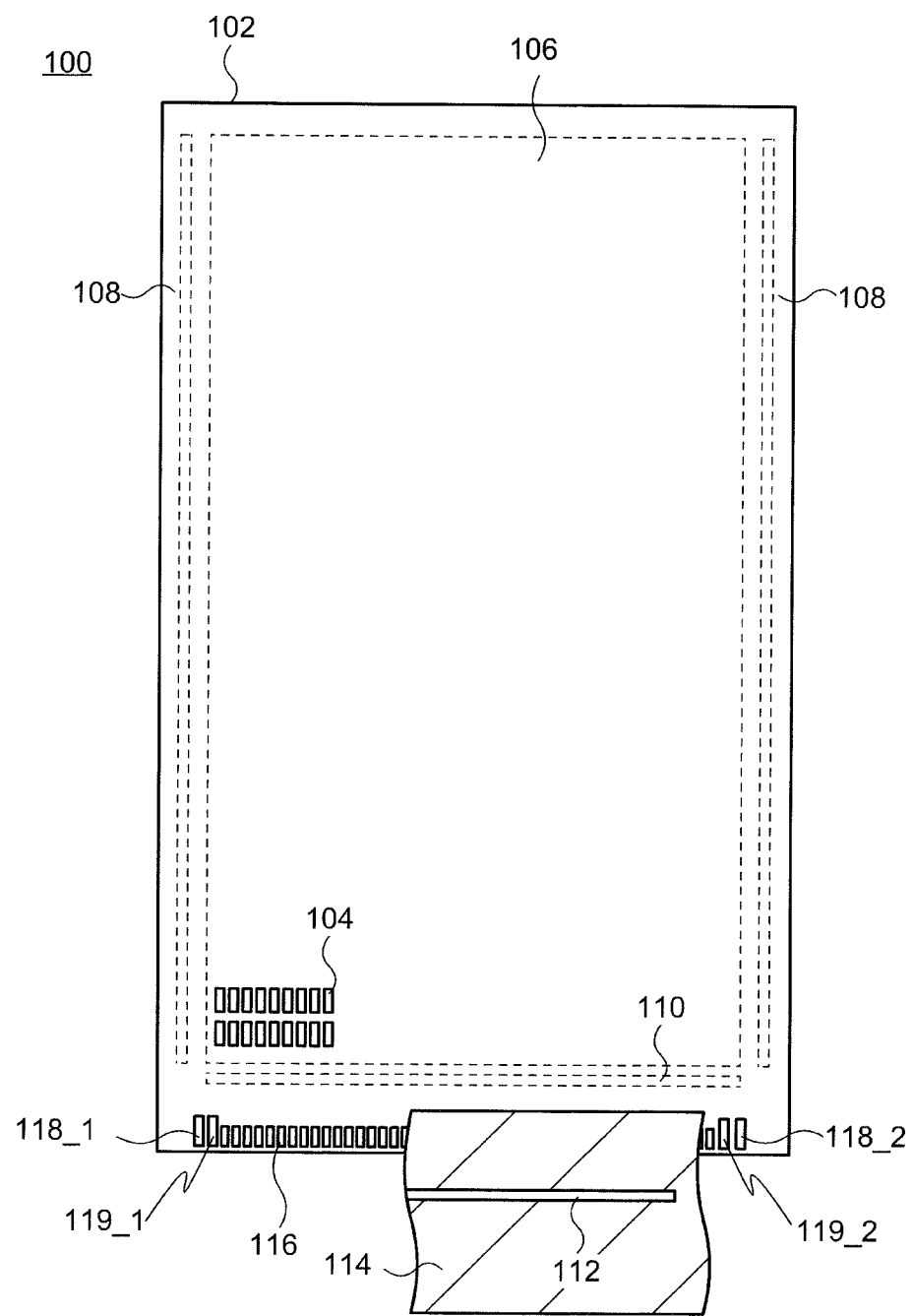
FIG. 2 is a schematic top view of a display device according to an embodiment.

A schematic top view of one display device 100 is shown in FIG. 2. The display device 100 has the substrate 102 obtained by dividing the mother glass and a variety of patterned insulating films, semiconductor films, and conductive films over the substrate 102. A plurality of pixels 104 and driver circuits (gate-side driver circuits 108 and source-side driver circuit 110) for driving the pixels 104 are formed by these insulating films, semiconductor films, and conductive films. The plurality of pixels is arranged periodically, by which a display region 106 is defined. As described below, a display element is disposed in each pixel 104. Hereinafter, an explanation is made by using an example in which a light-emitting element 140 is provided in each pixel 104 as a display element. As described below in detail, the light-emitting element 140 possesses a pixel electrode 180, an opposing substrate 124, and an EL layer 182 sandwiched therebetween as a fundamental structure, and light emission from the EL layer 182 can be extracted from the opposing electrode 124.

The gate-side driver circuits 108 and the source-side driver circuit 110 are arranged in a region (periphery region) surrounding the display region 106. A variety of wirings (not illustrated) formed with patterned conductive films extends from the display region 106, the gate-side driver circuits 108, and the source-side driver circuit 110 to a side of the substrate 102 and is exposed at a vicinity of an edge portion of the substrate 102 to form image-signal terminals 116 and power-source terminals 118 and 119. These terminals are electrically connected to a connector 114 such as a flexible printed circuit (FPC) substrate. In the example shown here, a driver IC 112 having an integrated circuit formed over a semiconductor substrate is mounted over the connector 114. Image signals supplied from an external circuit (not illustrated) are converted to signals for display by the driver IC 112, and the signals for display are supplied to the gate-side driver circuits 108 and the source-side driver circuit 110 through the connector 114 and the image-signal terminals 116. On the other hand, a power source supplied to the light-emitting elements 140 in the pixels 104 is provided to the display device 100 through the connector 114 and the power-source terminals 118 and 119. A high potential (PVDD) is supplied to the power-source terminals 119, while the power-source terminals 118 are supplied with a potential PVSS lower than the PVDD. At least two power-source terminals 118 (118_1, 118_2) are disposed. Each pixel 104 is controlled and operated on the basis of these signals for display and potentials, by which an image is displayed in the display region 106.

Figure 3A:
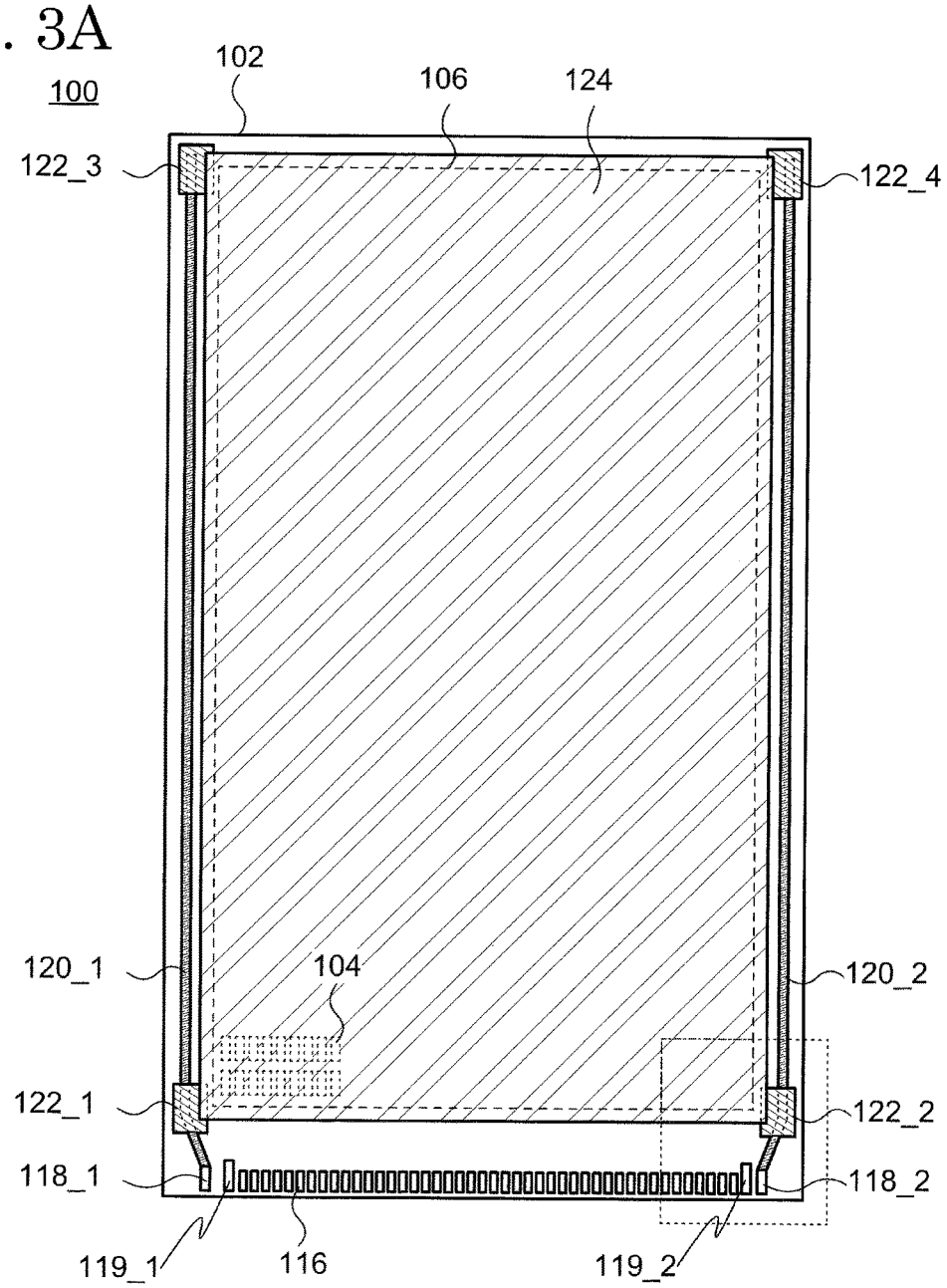
FIG. 3A and FIG. 3B are schematic top views of a display device according to an embodiment.
Figure 3B:
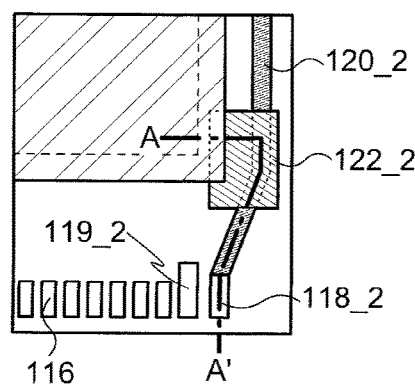

FIG. 3A shows an arrangement of two wirings 120 (first wiring 120_1 and second wiring 120_2) including the power-source terminals 118_1 and 118_2 in addition to the opposing electrode 124 of the light-emitting element 140. FIG. 3B is an enlarged figure of a region surrounded by a dotted line in FIG. 3A. The first wiring 120_1 and the second wiring 120_2 are formed over the substrate 102 and arranged parallel to a side (here, a long side) of the substrate 102 so as to sandwich the display region 106 including the pixels 104. The first wiring 120_1 and the second wiring 120_2 are spaced from each other and are not in direct contact with each other. The opposing electrode 124 is shared by the plurality of pixels 104.

At least one contact electrode 122 is disposed over each of the first wiring 120_1 and the second wiring 120_2. In the example shown in FIG. 3A, two contact electrodes (a first contact electrode 122_1 and a third contact electrode 122_3) are provided so as to cover a part of the first wiring 120_1, and two contact electrodes (a second contact electrode 122_2 and a fourth contact electrode 122_4) are provided so as to cover a part of the second wiring 120_2. The first wiring 120_1 is electrically connected to the first contact electrode 122_1 and the third contact electrode 122_3. In a similar way, the second wiring 120_2 is electrically connected to the second contact electrode 122_2 and the fourth contact electrode 122_4.

There are two conductive routes between the first contact electrode 122_1 and the third contact electrode 122_3. One is a route passing through the first wiring 120_1 without passing through the opposing electrode 124, and the other is a conductive route passing through the opposing electrode 124. Here, conductivities of the first wiring 120_1, the second wiring 120_2, and the contact electrodes 122 are higher than that of the opposing electrode 124 as described below. Therefore, the conductive route between the first contact electrode 122_1 and the third contact electrode 122_3, which exhibits the maximum conductivity, does not include the opposing electrode 124. Similarly, there are two conductive routes between the second contact electrode 122_2 and the fourth contact electrode 122_4. One is a route which does not pass through the opposing electrode 124 but passes through the second wiring 120_2, while the other passes through the opposing electrode 124. Hence, the conductive route between the second contact electrode 122_2 and the fourth contact electrode 122_4, which exhibits the maximum conductivity, does not include the opposing electrode 124.

Furthermore, the first contact electrode 122_1 and the third contact electrode 122_3 are electrically connected to the second contact electrode 122_2 and the fourth contact electrode 122_4. However, the conductive route thereof includes the opposing electrode 124, and there is no conductive route which does not include the opposing electrode 124. Hence, although the power-source terminals 118 are electrically connected to each other through the first wiring 120_1, the second wiring 120_2, and the contact electrodes 122, the conductive route between the power-source terminals 118 includes the opposing electrode 124, and there is no conductive route which does not include the opposing electrode 124. Therefore, the resistance of the opposing electrode 124 is reflected in the resistivity (or conductivity) between the power-source terminals 118, and the resistivity of the opposing electrode 124 which dominantly behaves as a resistance can be measured by measuring the resistivity between the power-source terminals 118_1 and 118_2.

The opposing electrode 124 is formed so as to cover at least a part of the contact electrodes 122. The opposing electrode 124 is connected to the first contact electrode 122_1 and the third contact electrode 122_3 and further electrically connected to the first wiring 120_1 therethrough. Similarly, the opposing electrode 124 is connected to the second contact electrode 122_2 and the fourth contact electrode 122_4 and further electrically connected to the second wiring 120_2 therethrough. Therefore, PVSS supplied from the power-source terminals 118_1 and 118_2 is provided to the opposing electrode 124 through the contact electrodes 122.

In the example shown in FIG. 3A, the opposing electrode 124 is spaced from the first wiring 120_1 in a region between the first contact electrode 122_1 and the third contact electrode 122_3. Similarly, the opposing electrode 124 is spaced from the second wiring 120_2 in a region between the second contact electrode 122_2 and the fourth contact electrode 122_4. Thus, the PVSS is supplied through four points in the opposing electrode 124. In the example shown here, since the opposing electrode 124 of the display device 100 has a substantially quadrangle shape, the PVSS is supped from the four corners of the opposing electrode 124. As described below, the wirings 120 are prepared so as to have a sufficiently low resistance compared with the opposing electrode 124. Therefore, it is possible to substantially uniformly supply a potential (PVSS) to the whole of the opposing substrate 124 even in the case where the sheet resistance of the opposing electrode 124 is high, by which a decrease in display quality can be avoided. Note that the number of the contact electrodes 122 is not limited, and five or more contact electrodes 122 may be disposed.

As described above, although spaced from each other, the first wiring 120_1 and the second wiring 120_2 are electrically connected to each other through the opposing electrode 124. Moreover, the first wiring 120_1 and the second wiring 120_2 have a sufficiently low resistance compared with the opposing electrode 124. Therefore, the conductive route between the first wiring 120_1 and the second wiring 120_2 includes the opposing electrode 124. More specifically, this conductive route includes a region of the opposing electrode 124 overlapping with the display region 106. Considering that the first wiring 120_1 and the second wiring 120_2 respectively include the power-source terminals 118_1 and 118_2, the conductive route between the power-source terminals 118_1 and 118_2 includes the region of the opposing electrode 124 overlapping with the display region 106, and there is no conductive route which does not include the opposing electrode 124.

2. Structure of Pixel 2-1. Pixel Circuit

A pixel circuit including the light-emitting element 140 is formed in each pixel 104 with a variety of patterned insulating films, semiconductor films, and conductive film. The structure of the pixel circuit may be arbitrarily selected, and an example is shown as an equivalent circuit in FIG. 4.

Figure 4:
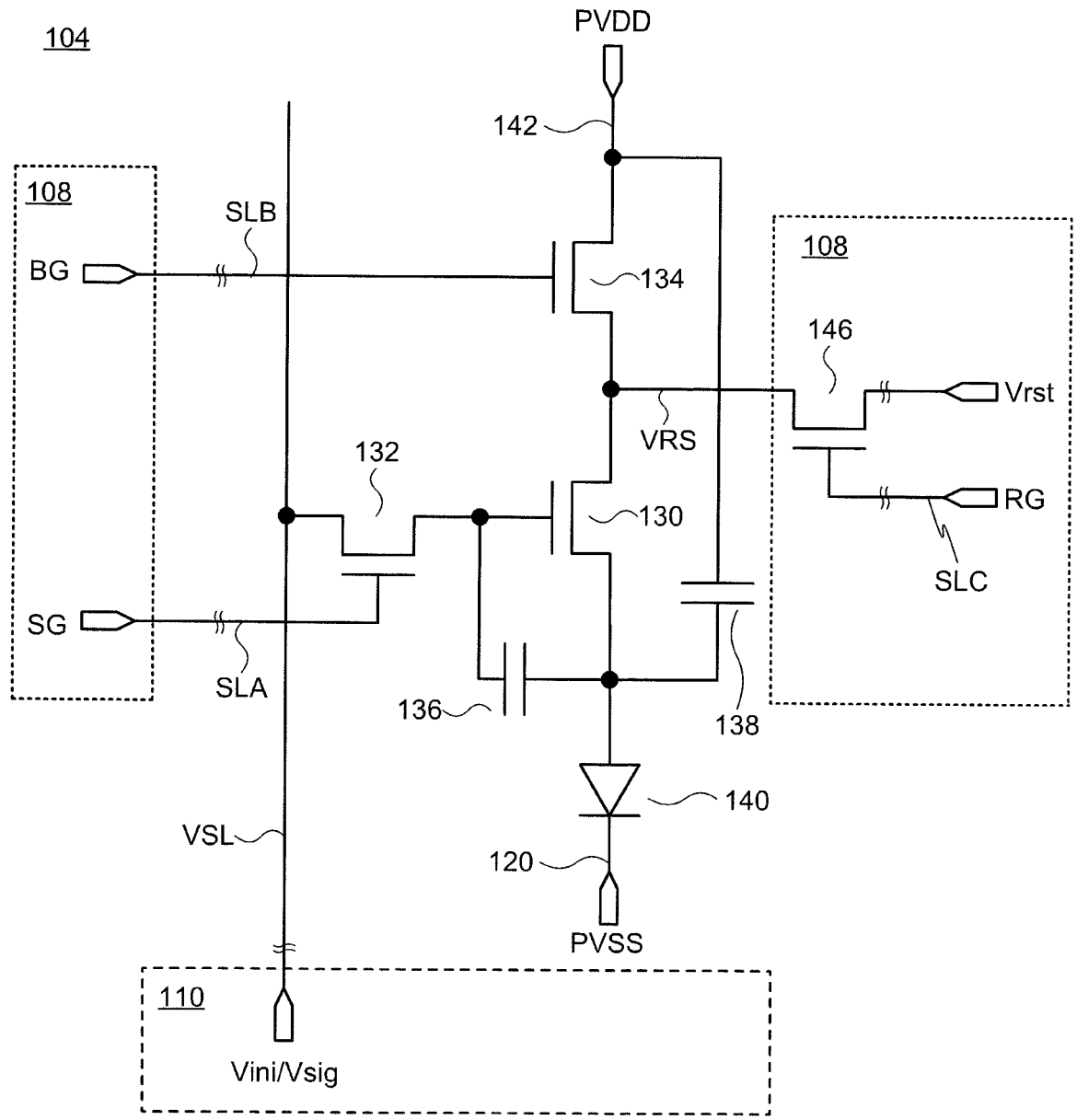
FIG. 4 is an example of an equivalent circuit of a pixel in a display device according to an embodiment.

The pixel circuit shown in FIG. 4 includes a driving transistor 130, a first switching transistor 132, a second switching transistor 134, a storage capacitor 136, and a supplementary capacitor 138 in addition to the light-emitting element 140. The light-emitting element 140, the driving transistor 130, and the second switching transistor 134 are connected in series between a high-potential power-source line 142 and the wiring 120. The high-potential power-source line 142 is provided with the PVDD supplied through the power-source terminals 119.

In the present embodiment, the driving transistor 130 is regarded as a n-channel type transistor, an input-output terminal on a side of the high-potential power-source line 142 is regarded as a drain, and an input-output terminal on a side of the light-emitting element 140 is regarded as a source. The drain of the driving transistor 130 is electrically connected to the high-potential power-source line 142 via the second switching transistor 134, and the source is electrically connected to a pixel electrode 180 of the light-emitting element 140.

The gate of the driving transistor 130 is electrically connected to a first signal line VSL via the first switching transistor 132. Operation (on/off) of the first switching transistor 132 is controlled with a scanning signal SG supplied to a first scanning signal line SLA connected to the gate thereof. When the first switching transistor 132 is on, a potential of the first signal line VSL is provided to the gate of the driving transistor 130. An initialization signal Vini and an image signal Vsig are supplied to the first signal line VSL at a predetermined timing. The initialization signal Vini is a signal providing an initialization potential having a constant level. The first switching transistor 132 synchronizes with the first signal line VSL, and on/off is controlled at a predetermined timing to provide the gate of the driving transistor 130 with a potential based on the initialization signal Vini or the image signal Vsig.

A second signal line VRS is electrically connected to the drain of the driving transistor 130. The second signal line VRS is supplied with a reset potential Vrst via a rest transistor 146. A timing of the reset signal Vrst supplied through the reset transistor 146 is controlled by a reset signal RG supplied to a third signal line SLC.

The storage capacitor 136 is arranged between the source and the gate of the driving transistor 130. One terminal of the supplementary capacitor 138 is connected to the source of the driving transistor 130, and the other terminal is connected to the high-potential power-source line 142. The supplementary capacitor 138 may be arranged so that the other terminal is connected to the wiring 120. The storage capacitor 136 and the supplementary capacitor 138 are provided in order to secure a gate-source voltage Vgs corresponding to the image signal Vsig when the image signal Vsig is supplied to the gate of the driving transistor 130.

The source-side driver circuit 110 outputs the initialization signal Vini or the image signal Vsig to the first signal line VSL. The gate-side driver circuits 108 output the scanning signal SG, the scanning signal BG, and the reset signal RG to the first scanning line SLA, the second scanning signal line SLB, and the third signal line SLC, respectively.

2-2. Cross-Sectional Structure

Figure 5A:
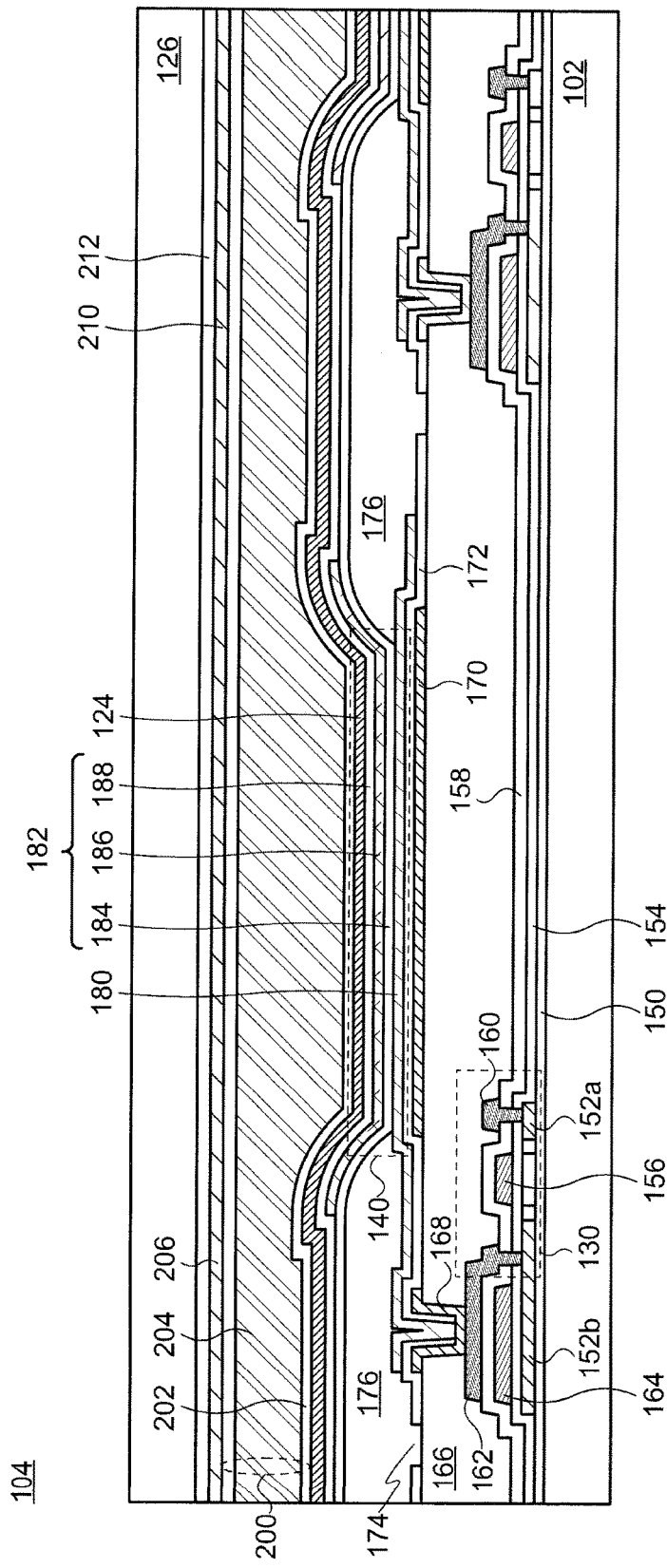
FIG. 5A and FIG. 5B are schematic cross-sectional views of a display device according to an embodiment.

The structure of the pixel 104 is explained by using a cross-sectional structure. FIG. 5A shows a cross-sectional structure of the driving transistors 130, the storage capacitors 136, the supplementary capacitors 138, and the light-emitting elements 140 in the pixel circuits of the adjacent two pixels 104.

Each element in the pixel circuit is provided over the substrate 102 through an undercoat 150. The driving transistor 130 includes a semiconductor film 152, a gate insulating film 154, a gate electrode 156, a drain electrode 160, and a source electrode 162. The gate insulating film 154 is formed to cover the semiconductor film 152. The gate electrode 156 is arranged so as to intersect at least a part of the semiconductor film 152 with the gate insulating film 154 therebetween, and a channel is formed in a region overlapping with the gate electrode 156. The semiconductor film 152 further possesses a drain region 152a and a source region 152b sandwiching the channel.

A capacitor electrode 164 existing in the same layer as the gate electrode 156 is disposed so as to overlap with the source region 152b through the gate insulating film 154. An interlayer insulating film 158 is formed over the gate electrode 156 and the capacitor electrode 164. Openings respectively reaching the drain region 152a and the source region 152b are formed in the interlayer insulating film 158 and the gate insulating film 154, and the drain electrode 160 and the source electrode 162 are arranged so as to cover the respective openings. A part of the source electrode 162 overlaps with a part of the source region 152b with the interlayer insulating film 158 therebetween, and the storage capacitor 136 is formed by the part of the source region 152b, the gate insulating film 154, the capacitor electrode 164, the interlayer insulating film 158, and the part of the source electrode 162.

A leveling film 166 is further provided over the driving transistor 130 and the storage capacitor 136. An opening reaching the source electrode 162 is formed in the leveling film 166, and a connection electrode 168 covering this opening and a part of a top surface of the leveling film 166 is disposed so as to be in contact with the source electrode 162. A supplementary capacitor electrode 170 is further arranged over the leveling film 166. The connection electrode 168 and the supplementary capacitor electrode 170 may be simultaneously formed and may exist in the same layer. An insulating film 172 is formed so as to cover the connection electrode 168 and the supplementary capacitor electrode 170. The insulating film 172 does not cover a part of the connection electrode 168 in the opening formed in the leveling film 186 to expose an upper surface of the connection electrode 168. This structure enables electrical connection between the pixel electrode 180 formed over the connection electrode 168 and the source electrode 162 through the connection electrode 168. An opening 174 may be formed in the insulating film 172 to allow contact between a partition wall 176 formed thereover and the leveling film 166. Impurities in the leveling film 166 can be removed through the opening 174, thereby increasing reliability of the pixel circuit and the light-emitting element 140. Note that the connection electrode 168 and the opening 174 may be arbitrarily formed.

The pixel electrode 180 is provided over the insulating film 172 so as to cover the connection electrode 168 and the supplementary capacitor electrode 170. The insulating film 172 is sandwiched by the supplementary capacitor electrode 170 and the pixel electrode 180, and this structure constructs the supplementary capacitor 138. The pixel electrode 180 is shared by the supplementary capacitor 138 and the light-emitting element 140.

Figure 5B:
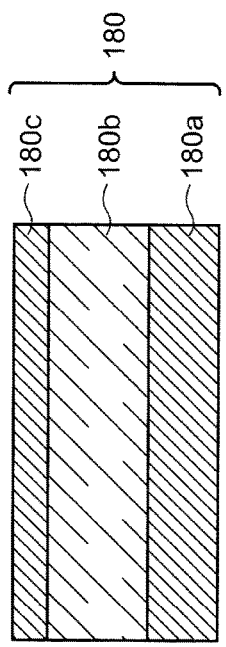

An example of a cross section of the pixel electrode 180 is shown in FIG. 5B. The pixel electrode 180 may include a conductive material exhibiting a transmitting property with respect to visible light, a metal such as silver and aluminum, or an alloy including one or more metals selected from these metals. The pixel electrode 180 may have a single-layer structure or a stacked-layer structure. In the case of the stacked-layer structure, a structure can be employed in which a first conductive layer 180a, a second conductive layer 180b over the first conductive layer 180a, and a third conductive layer 180c over the second conductive layer 108b are stacked in this order, for example.

The first conductive layer 180a has a transmitting property with respect to visible light and may include a conductive oxide such as ITO and IZO. The first conductive layer 180a has a function to more strongly adhere to the second conductive layer 180b and the insulating film 172. The second conductive layer 180b is preferred to have a high reflectance with respect to visible light, and may include 0-valent silver, aluminum, or magnesium, or an alloy including a metal selected therefrom. A thickness of the second conductive layer 180b may be equal to or larger than 100 nm and equal to or smaller than 200 nm, equal to or larger than 120 nm and equal to or smaller than 160 nm, or equal to or larger than 120 nm and equal to or smaller than 140 nm, and typically 130 nm. Since such a thickness does not allow visible light to pass therethrough, the second conductive layer 180b exhibits a high reflectance. Thus, light-emission obtained from the light-emitting element 140 is efficiently reflected and can be extracted through the opposing substrate 126. Moreover, formation of the second conductive layer 180b at such a thickness provides a sufficiently low electrical resistance. The third conductive layer 180c has a transmitting property with respect to visible light and may typically include a conductive oxide such as ITO and IZO. Since ITO and IZO have a relatively high work function, holes can be efficiently injected to the EL layer 182 when the pixel electrode 180 servers as an anode.

The partition wall 176 covering an edge portion of the pixel electrode 180 is formed over the pixel electrode 180. The EL layer 182 and the opposing electrode 124 thereover are provided so as to cover the pixel electrode 180 and the partition wall 176. In the present specification and the claims, the EL layer 182 means all of the layers provided between the pixel electrode 180 and the opposing electrode 124.

The EL layer 182 may be composed of a plurality of layers and is formed by appropriately combining a variety of functional layers such as a carrier-injection layer, a carrier-transporting layer, an emission layer, a carrier-blocking layer, and an exciton-blocking layer, for example. The structure of the EL layer 182 may be the same between all of the pixels 104, or the EL layer 182 may be formed so that the structure thereof is different between the adjacent pixels 104. For example, the EL layer 182 is formed so that the structure or the material of the emission layer is different between the adjacent pixels 104, by which light-emissions with different colors can be obtained from the adjacent pixels 104. When the same EL layer 182 is used in all of the pixels 104, a plurality of emission colors is attainable by providing a color filter which is not illustrated. In FIG. 5A, a hole-transporting layer 184, an emission layer 186, and an electron-transporting layer 188 are shown as typical functional layers.

A protection film (hereinafter, referred to as a passivation film) 200 for protecting the light-emitting elements 140 is disposed over the light-emitting elements 140. The structure of the passivation film 200 can be arbitrarily selected, and a stacked structure including a first layer 202 containing an inorganic compound, a second layer 204 containing an organic compound, and a third layer 206 containing an inorganic compound may be employed as shown in FIG. 5A.

A film (hereinafter, referred to as a resin film) including a resin is provided over the passivation film 200, and the opposing substrate 126 is fixed over the substrate 102 through an adhesive layer 212.

3. Opposing Electrode, Wiring, and Contact Electrode

The connection structure between the opposing electrode 124, the wiring 120, and the contact electrode 122 is explained by using a schematic view of a cross section (FIG. 6A) along a chain line A-A' in FIG. 3B. FIG. 6A corresponds to a portion from the display region 106 to the peripheral region and schematically shows a part of the pixel 104, the gate-side driver circuit 108, the wiring 120, and the power-source terminal 118.

The gate-side driver circuit 108 has a variety of circuits (buffer circuit, latch circuit, and the like) including a plurality of transistors. These transistors are prepared in the same process as the transistors in the pixel circuits. The wiring 120 (here, the second wiring 120_2) is formed in the same process as the source electrode and drain electrode of the transistor (for example, the drain electrode 160 and the source electrode 162 of the driving transistor 130), thereby allowing them to exist in the same layer. The wiring 120 is disposed over the interlayer insulating film 158, and a part thereof is covered by the leveling film 166 extending from the display region 106. A portion of the wiring 120 exposed from the leveling film 166 is covered by the insulating film 172. However, a part of the wiring 120 is exposed from the insulating film 172 on a side of the edge portion of the substrate 102 to form the power-source terminal 118. Although not illustrated, the wiring 120 may be formed in the same process as the gate electrodes of the transistors in the pixel circuits.

An opening reaching the wiring 120 is formed in the leveling film 166 overlapping with the wiring 120, and the contact electrode 122 is arranged so as to cover this opening. As shown in FIG. 6A, the contact electrode 122 may include two conductive films. Specifically, the contact electrode 122 may include a lower electrode 122a in contact with the wiring 120 and an upper electrode 122b formed over the lower electrode 122a. The insulating film 172 exposes a part of the lower electrode 122a in the opening, by which electrical connection between the upper electrode 122b and the lower electrode 122a is achieved. In other words, the upper electrode 122b is electrically connected to the lower electrode 122 through the insulating film 172.

When the opening is prepared in the leveling film 166, a dam 167 may be formed by removing a part of the leveling film 166 between the opening and the edge portion of the substrate 102. It is preferred that the leveling film 166 do not exist between the dam 167 and the edge portion of the substrate 102. As described below, the second layer 204 of the passivation film 200 is formed by using a fluid raw material. Thus, the formation of the dam 167 does not allow the raw material to cross over the dam 167, by which the second layer 204 can be selectively arranged over the display region 106 and the contact electrode 122.

The lower electrode 122a may exist in the same layer as the connection electrode 168 and the supplementary capacitor electrode 170 in the pixel 104. In this case, the lower electrode 122a, the connection electrode 168, and the supplementary capacitor electrode 170 possess the same composition. On the other hand, the upper electrode 122b may exist in the same layer as the pixel electrode 180. Hence, when the pixel electrode 180 has the three-layer structure shown in FIG. 5B, for example, the upper electrode 122b also has the same three-layer structure. Note that, in the power-source terminal 118, the portion of the wiring 120 exposed from the insulating film 172 may be covered with a protection electrode 122c existing in the same layer as the lower electrode 122a. This structure prevents oxidation of a surface of the wiring 120 in the power-source terminal 118.

The partition wall 176 covers an edge portion of the upper electrode 122b, and the opposing electrode 124 extends from the display region 106 across over the partition wall 176 and overlaps with the upper electrode 122b, by which the opposing electrode 124 is electrically connected to the wiring 120 through the contact electrode 122.

Similar to the pixel 104, the passivation film 200 is arranged over the opposing electrode 124 overlapping with the contact electrode 122, over which the resin film 210 is formed. As described below, the resin film 210 is used for patterning the first layer 202 and the third layer 206 of the passivation film 200.

The adhesive layer 212 is provided so as to overlap with an upper surface and a side surface of the resin film 210, and the opposing substrate 126 is fixed over the substrate 102 by using the adhesive layer 212. The opposing substrate 126 is disposed so as not to overlap with the image-signal terminals 116 and the power-source terminals 118 and 119.

As describe above, the contact electrode 122 may be configured to include the lower electrode 122a and the upper electrode 122b. However, it is not necessary for the contact electrode 122 to include two electrodes. For example, as shown in FIG. 6B, the contact electrode 122 may be structured so that the lower electrode 122a is in direct contact with the opposing electrode 124 by forming the lower electrode 122a, which exists in the same layer as the connection electrode 168, in the opening in the leveling film 166 to allow the lower electrode 122a to be in contact with the wiring 120.

4. Manufacturing Method and Manufacture-Managing Method

Hereinafter, a manufacturing method of the display device 100 and a manufacture-managing method are explained by using FIG. 7A to FIG. 11. Three cross-sections illustrated in each of FIG. 7A to FIG. 10 respectively correspond to a cross section of the pixel 104, a cross section of a region centering the contact electrode 122, and a cross section of a region centering the power-source terminal 118 from the left.

4-1. Pixel Circuit

As described above, the plurality of display devices 100 is fabricated over the mother glass shown in FIG. 1. First, the undercoat 150, the semiconductor film 152, the gate insulating film 154, the gate electrode 156, and the capacitor electrode 164 are formed over the substrate 102 which is the mother glass as shown in FIG. 7A. The semiconductor film 152 is appropriately subjected to doping to form the drain region 152a and the source region 152b. Next, the interlayer insulating film 158 is formed over the gate electrode 156 and the capacitor electrode 164 (FIG. 7A). After that, etching is performed on the interlayer insulating film 158 and the gate insulating film 154 to form the openings reaching the drain region 152a and the source region 152b. Detailed explanation is omitted because the process up to this state can be carried out with known methods and materials.

Next, the wiring 120 as well as the drain electrode 160 and the source electrode 162 are formed so as to cover these openings (FIG. 7B). With this process, the transistors in the pixel circuits including the driving transistor 130 and the storage capacitor 136 are formed. The drain electrode 160, the source electrode 162, and the wiring 120 may include a metal such as aluminum, copper, molybdenum, titanium, tungsten, and tantalum or an alloy thereof and are formed by applying a sputtering method or a chemical vapor deposition (CVD) method so as to have a single-layer structure or a stacked-layer structure. Therefore, the drain electrode 160, the source electrode 162, and the wiring 120 have a sufficiently low resistivity.

Next, the leveling film 166 is formed (FIG. 7C). The leveling film 166 includes a polymer such as an epoxy resin, an acrylic resin, or a polyamide and is formed by applying the polymer over substantially the whole of the substrate 102 with a wet-type film-formation method such as a spin-coating method, an ink-jet method, or a printing method, and then curing the polymer. Although not illustrated, an insulating film including a silicon-containing inorganic compound such as silicon oxide or silicon nitride may be formed over the drain electrode 160 and the source electrode 162 before forming the leveling film 166. The layer including a silicon-containing inorganic compound is formed with a sputtering method or a CVD method.

Next, etching is performed on the leveling film 116 to form the opening reaching the source electrode 162 and an opening for forming the contact electrode 122 (FIG. 7C). At the same time, the leveling film 166 in a region in which the power-source terminal 118 to be formed is removed.

Next, the supplementary capacitor electrode 170 is formed over the leveling film 166, while forming the connection electrode 168, the lower electrode 122a, and the protection electrode 122c to cover the openings prepared in the leveling film 166 (FIG. 8A). These electrodes may be prepared with a sputtering method using a target including a conductive oxide. With this process, it is possible to prevent oxidation of surfaces of the source electrode 162 and the wiring 120 in the following processes. After that, the insulating film 172 including a silicon-containing inorganic compound is formed with a CVD method or the like so as to cover the supplementary capacitor electrode 170. The insulating film 172 is subjected to patterning to expose the upper surfaces of the connection electrode 168, the lower electrode 122a, and the protection electrode 122c.

Next, the upper electrode 122b is formed while forming the pixel electrode 180 (FIG. 8B). The pixel electrode 180 and the upper electrode 122b are disposed so as to respectively cover the openings reaching the source electrode 162 and the wiring 120. As a result, the pixel electrode 180 is electrically connected to the source electrode 162 through the connection electrode 168, and the upper electrode 122b is electrically connected to the wiring 120 through the lower electrode 122a. The pixel electrode 180 is provided so as to overlap with the supplementary capacitor electrode 170 to give the supplementary capacitor 138 in association with the insulating film 172 sandwiched therebetween. The pixel electrode 180 and the upper electrode 122b can be fabricated by, for example, forming the first conductive layer 180a including IZO or ITO with a sputtering method, forming the second conductive layer 180b including a metal such as silver or aluminum with a CVD method, and forming the third layer 180c including a conductive oxide with a sputtering method (see FIG. 5B). With this process, an ability to reflect visible light is provided to the pixel electrode 180.

After that, the partition wall 176 is formed so as to cover the edge portions of the pixel electrodes 180 and the upper electrode 122b (FIG. 8B). The partition wall 176 can be formed with the same method as that of the leveling film 166. After forming the partition wall 176, the EL layer 182 of the light-emitting element 140 is formed (FIG. 9A). The EL layer 182 is prepared with an evaporation method, an ink-jet method, a printing method, a spin-coating method, or the like.

Next, the opposing electrode 124 is prepared with an evaporation method, a sputtering method, or the like. The opposing electrode 124 is formed so as to partly transmit and partly reflect visible light. Specifically, a metal film including silver, magnesium, or an alloy thereof is formed at a thickness which allows visible light to transmit therethrough (e.g., in a range from a few nanometers to 50 nanometers). A film including a conductive oxide such as ITO and IZO may be stacked over the metal film. The formation of the opposing electrode 124 in such a way enables the formation of the light-emitting element 140 with a so-called top-emission type.

At this time, the opposing electrode 124 is formed so as to cover the EL layer 182 and the upper electrode 122b (FIG. 9A). The opposing electrode 124 may completely cover the EL layer 182, by which the opposing electrode 124 is electrically connected to the wiring 120 through the contact electrode 122. Through the aforementioned processes, the pixel circuit is fabricated.

4-2. Estimation of Thickness of Opposing Electrode

As described above, the light-emitting element 140 can be fabricated as a top-emission type light-emitting element where the pixel electrode 180 and the opposing electrode 124 serve as an electrode reflecting visible light and a semi-reflective semi-transmitting electrode, respectively. This structure provides a resonance structure in the light-emitting element 140 in which the light obtained from the EL layer 182 is repeatedly reflected between the pixel electrode 180 and the opposing electrode 124 and interferes with each other. Therefore, the light emission can be resonated and amplified by appropriately adjusting an optical distance of the light-emitting element 140, which enables improvement of emission efficiency and adjustment of emission color (optical adjustment).

However, the optical interference in the resonance structure is greatly influenced by the reflectance and transmittance of the opposing electrode 124. Additionally, since the opposing electrode 124 includes a 0-valent metal and is formed so as to transmit visible light, a thickness thereof is relatively small. Therefore, a thickness margin is small, and therefore, a change in thickness of the opposing electrode 124 according to variation of conditions for forming the opposing electrode 124 leads to a significant change in properties of the light-emitting element 140, which increases variation in properties of the display device 100.

Thus, in the present embodiment, manufacture management is performed by measuring the resistance (or conductivity) between the first wiring 120_1 and the second wiring 120_2 after forming the opposing electrode 124 to estimate the thickness of the opposing electrode 124 from the measured value in the present embodiment.

Figure 11:
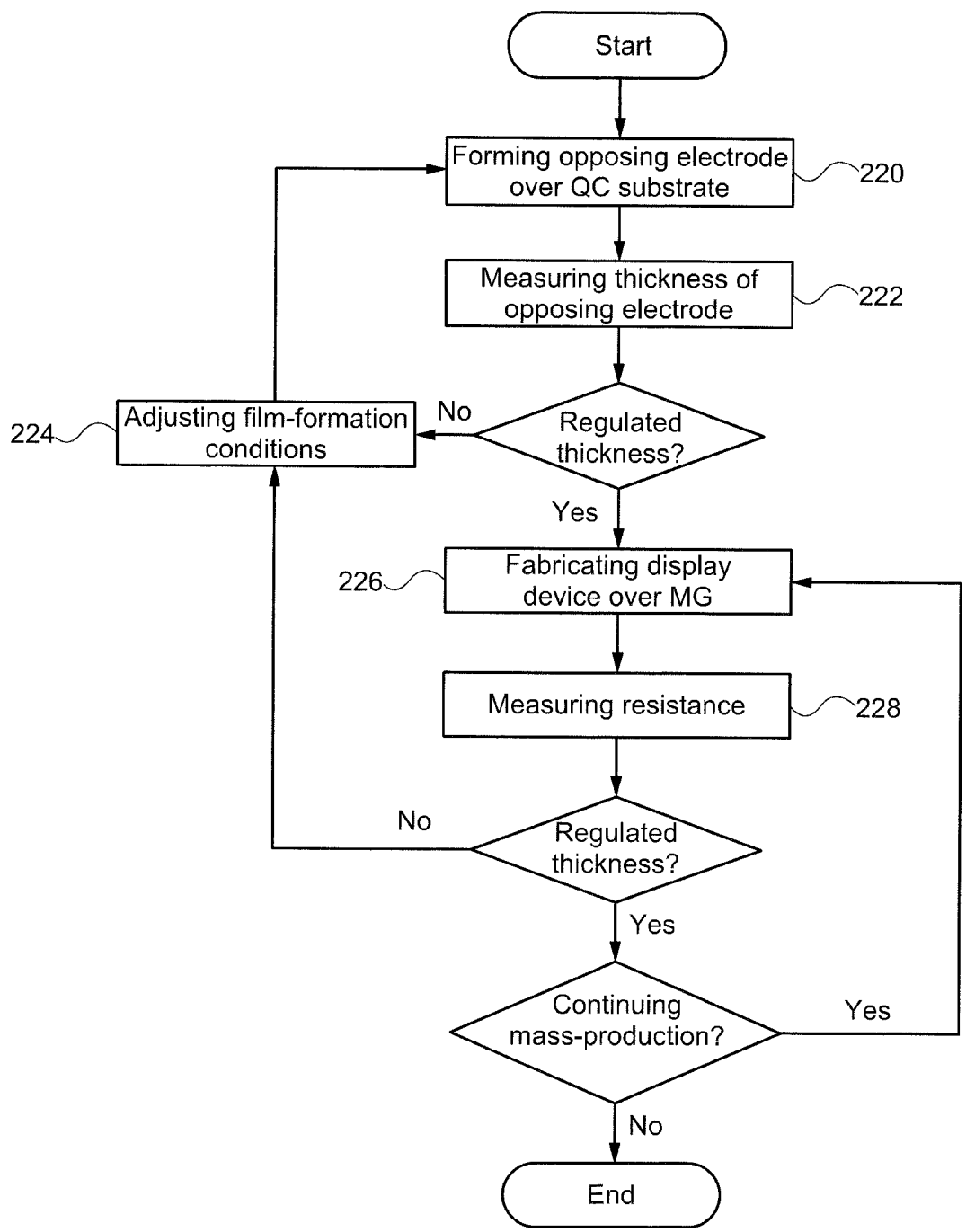
FIG. 11 is a flow chart of a manufacture-managing method of a display device according to an embodiment.

A more specific method is shown by the flow in FIG. 11. First, the opposing electrode 124 is formed directly over the mother glass in a chamber in which the opposing electrode 122 of the display device 100 is formed (step 220). The mother glass at this step is called a QC substrate. The film-formation conditions at this step are set to be the same as those of the opposing substrate 124 of the display device 100. After that, the thickness of the obtained opposing electrode 124 is measured with a spectrum ellipsometer and the like (step 222) and used to judge whether the employed film-formation conditions are suitable for the formation conditions of the opposing electrode 124 of the display device 100. The obtained thickness is used to judge whether the film-formation conditions are suitable or not. If the conditions are judged to be unsuitable, the display devices 100 are not manufactured but the film-formation conditions are adjusted (step 224). After adjustment, the opposing substrate 124 is formed again over a QC substrate, and the thickness is measured. These steps are repeated until the adjustment is completed.

In the case where the adjustment of the formation conditions of the opposing electrode 124 is completed, that is, in the case where the thickness of the opposing electrode 124 falls within a regulated region, the manufacture of the display devices 100 is started by using a new mother glass according to the method described above (step 226). After forming the opposing electrode 124 over one mother glass, the resistance between the first wiring 120_1 and the second wiring 120_2 is measured by using the two power-source terminals 118_1 and 118_2 (step 228). As described above, the conductive route between the power-source terminals 118_1 and 118_2 includes the opposing substrate 124. Additionally, the resistance of the wirings 120 is sufficiently low compared with that of the opposing electrode 124. Hence, the resistance (sheet resistance) of the opposing electrode 124 is reflected in the resistance between the power-source terminals 118_1 and 118_2. Since the area and shape of the opposing electrode 124 and a distance between the first wiring 120_1 and the second wiring 120_2 are fixed, the resistance of the opposing electrode 124 is determined by the thickness thereof. Therefore, the thickness of the opposing electrode 124 can be readily estimated by the obtained resistivity in a non-destructive manner in a short time.

On the other hand, in the references described above, two or more potential-supplying terminals for the opposing electrode are electrically connected to one another over the substrate through a conductive layer other than the opposing electrode commonly disposed for the light-emitting elements. That is, there is a conductive route which does not include the opposing electrode between two potential-supplying terminals. Hence, in the display devices disclosed in these references, a thickness of the opposing electrode cannot be readily measured over the substrate. Additionally, it is impossible to measure the thickness from a resistance between two potential-supplying terminals for the opposing electrode.

In contrast, unlike the display device disclosed in the aforementioned reference, the display device 100 according to the present embodiment does not have a structure in which the two power-source terminals 118 are connected with a layer other than the opposing electrode 124. That is, there is no conductive route which does not include the opposing electrode 124 between the two power-source terminals 118, and the resistivity of the opposing electrode 124 is reflected in the resistivity between the power-source terminals 118. Therefore, the resistivity of the opposing electrode 124 which dominantly behaves as a resistance can be measured by measuring the resistance between the two power-source terminals 118.

In a case where the thickness of the opposing electrode 124 estimated on the basis of the obtained resistivity falls within a regulated range, the measurement results mean that the conditions for forming the opposing substrate 124 do not significantly vary, and the display devices 100 are successively manufactured by using a new mother glass. Since the measurement of the resistance can be conducted in a short time, it is possible to inspect the thickness of the opposing electrode 124 after treating every mother glass and rapidly obtain feedback from the results. Hence, quality management can be conducted on every mother glass while continuing mass-production.

On the other hand, in a case where the thickness of the opposing electrode 124 is judged to exceed the regulated range on the basis of the resistivity, it is possible to judge that the conditions for forming the opposing electrode 124 have been varied. Therefore, manufacture of the display devices 100 using a new mother glass is postponed, and the adjustment of the film-formation conditions can be immediately carried out (step 224). Therefore, it is possible to prevent mixing of defective devices.

According to the traditional manufacture-managing method, it is necessary to sample and dismantle the display devices 100 obtained after dividing the mother glass in order to measure the thickness of the opposing electrode 124. This method is a destructive measurement method and requires a long time for measurement. Therefore, the measurement is carried out after inputting a plurality of mother glasses into the process, and therefore, it is impossible to rapidly respond to variation in conditions for forming the opposing electrode 124, which causes production of a great number of defective articles.

On the other hand, according to the display device 100 and the manufacture-managing method of the display device 100 described in the present embodiment, the thickness of the opposing electrode 124 can be estimated in a non-destructive manner in a short time. Accordingly, it is possible to realize precise manufacture management and mass-production of a display device whose quality is controlled in a high level.

4-3. Passivation Film

After measuring the resistance of the opposing electrode 124, passivation film 200 is formed over the opposing electrode 124 (FIG. 9B). When the passivation film 200 has the three-layer structure, the first layer 202 including a silicon-containing compound is prepared with a CVD method, which is followed by the formation of the second layer 204 including a polymer such as an acrylic resin or an epoxy resin, for example. The second layer 204 is formed by applying oligomers serving as a raw material with a wet-type film-formation method, an evaporation method, a spray method, or the like, and then polymerizing the oligomers. The third layer 206 is then formed with a CVD method. At this time, the first layer 202 and the third layer 206 are formed so as to cover not only the pixel 104 but also the insulating film 172 over the wiring 120 and the protection electrode 122c as shown in FIG. 9B.

Figure 10:
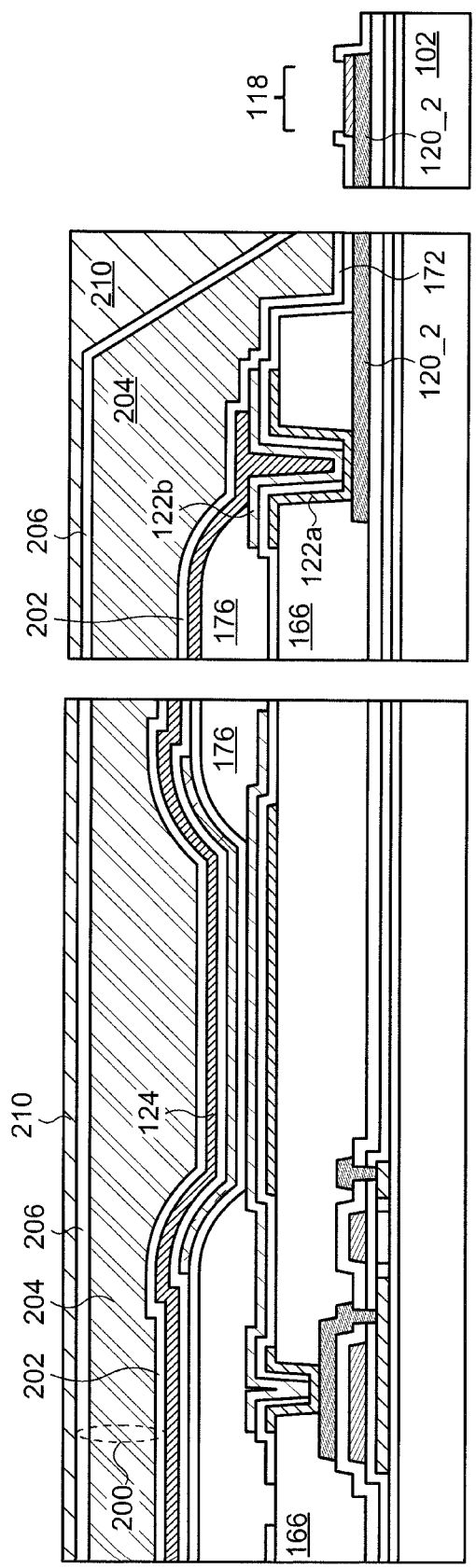
FIG. 10 is a schematic cross-sectional view for explaining a manufacturing method of a display device according to an embodiment.

Next, the resin film 210 is formed (FIG. 10). The resin film 210 includes a resin such as an epoxy resin or an acrylic resin and may be prepared by applying oligomers serving as a raw material with a wet-type film-formation method, an evaporation method, a spray method, or the like, and then polymerizing the oligomers. The resin film 210 functions as a mask for patterning the first layer 202 and the third layer 206. Specifically, the resin film 210 is formed so as not to cover the power-source terminal 118 but to overlap with the contact electrode 122 as shown in FIG. 10. After that, the first layer 202 and the third layer 206 are partly removed by etching using the resin film 210 as a mask to expose the protection electrode 122c, resulting in the formation of the power-source terminal 118.

Note that the first layer 202 and the third layer 206 of the passivation film 200 may be formed with a CVD method using a shadow mask. In this case, the first layer 202 and the third layer 206 are not formed over the power-source terminals 118 and 119 and the image-signal terminal 116 but are arranged so as to selectively cover the opposing electrode 124 and the contact electrode 122. Hence, the formation of the resin film 210 and the following etching can be omitted.

After that, the adhesive layer 212 is applied, the opposing substrate 126 is placed over the substrate 102, and the adhesive layer 212 is cured, thereby fixing the opposing substrate 126. Then, division into the individual display devices 100 is carried out.

In the present embodiment, an example is demonstrated in which the measurement of the resistance of the opposing electrode 124 is performed before forming the passivation film 200. However, the resistance measurement may be performed after forming the passivation film 200 and the power-source terminal 118.

Additionally, the wiring 120 may not be simultaneously formed with the drain electrode 160 and the source electrode 162 but may be simultaneously formed with the supplementary capacitor electrode 170 or the pixel electrode 180.

Second Embodiment

In the present embodiment, display devices with a structure different from that of the display device 100 are explained. An explanation of the structure the same as or similar to that of the First Embodiment may be omitted.

Figure 12A:
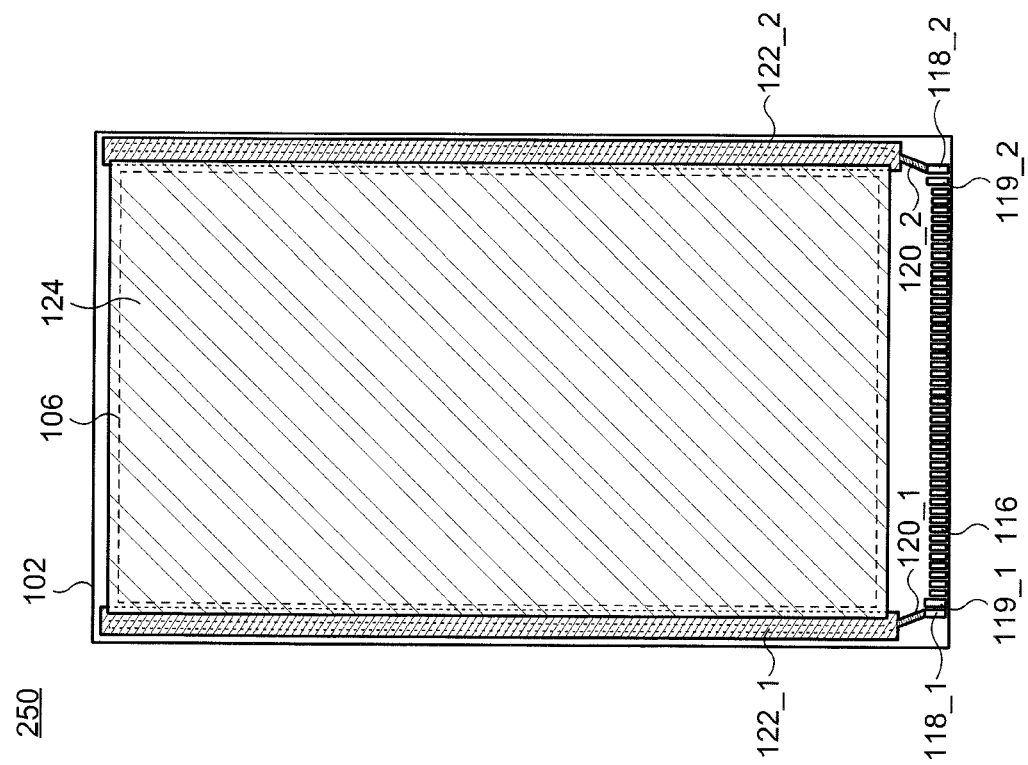
FIG. 12A and FIG. 12B are schematic top views of a display device according to an embodiment.
Figure 12B:
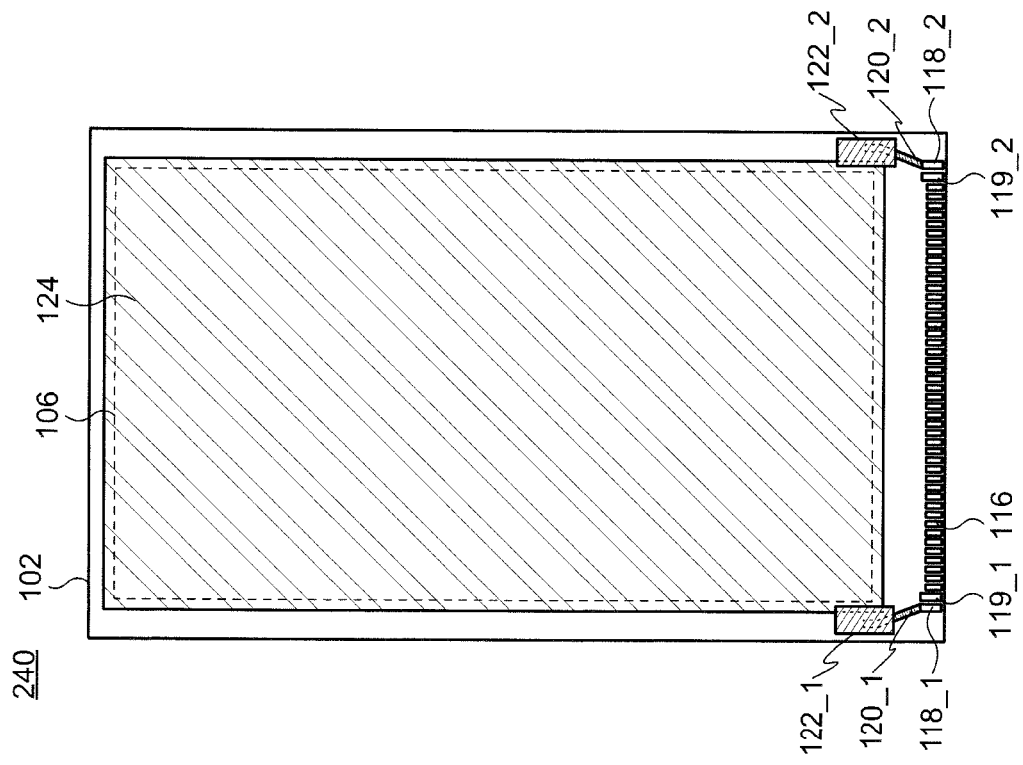

The display devices 240 and 250 according to the present embodiment are different from the display device 100 in that a single contact electrode 122 is respectively connected to the first wiring 120_1 and the second wiring 120_2 as shown in FIG. 12A and FIG. 12B. The contact electrodes 122 may be in contact with the vertexes of the opposing electrode 124 and the vicinity thereof as demonstrated by the display device 240 (FIG. 12A) or may be in contact with the whole of a side of the opposing electrode 124 (long side in this case) as demonstrated by the display device 250. In the display devices 240 and 250, the conductive route between the power-source terminals 118_1 and 118_2 also includes the region of the opposing electrode 124 overlapping with the display region 106, and there is no conductive route which does not include the opposing electrode 124. Hence, the thickness of the opposing electrode 124 can be readily estimated in a short time by measuring the resistance between the power-source terminals 118_1 and 118_2.

Third Embodiment

In the present embodiment, display devices with a structure different from that of the display devices described in the First and Second Embodiments are explained. An explanation of the structure the same as or similar to that of the First and Second Embodiments may be omitted.

Figure 13A:
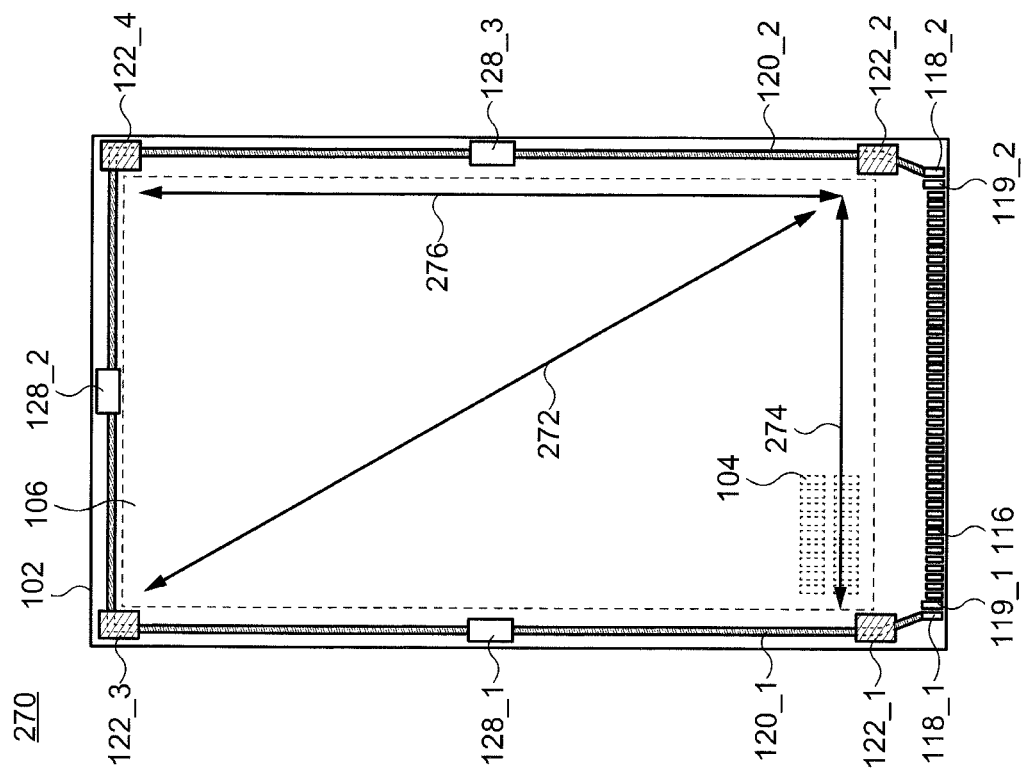
FIG. 13A and FIG. 13B are schematic top views of a display device according to an embodiment.

As shown in FIG. 13A, the display device 260 according to the present embodiment is different from the display device 100 in that the first wiring 120_1 and the second wiring 120_2 each extend between the side of the substrate 102 on which the power-source terminals 118 and the image-signal terminals 116 are not disposed and the display region 106 and that the first wiring 120_1 and the second wiring 120_2 are connected via a switch 128. A transistor may be utilized as the switch 128, and an on/off of the switch 128 is controlled with a potential supplied from a wiring which is not illustrated.

Figure 13B:
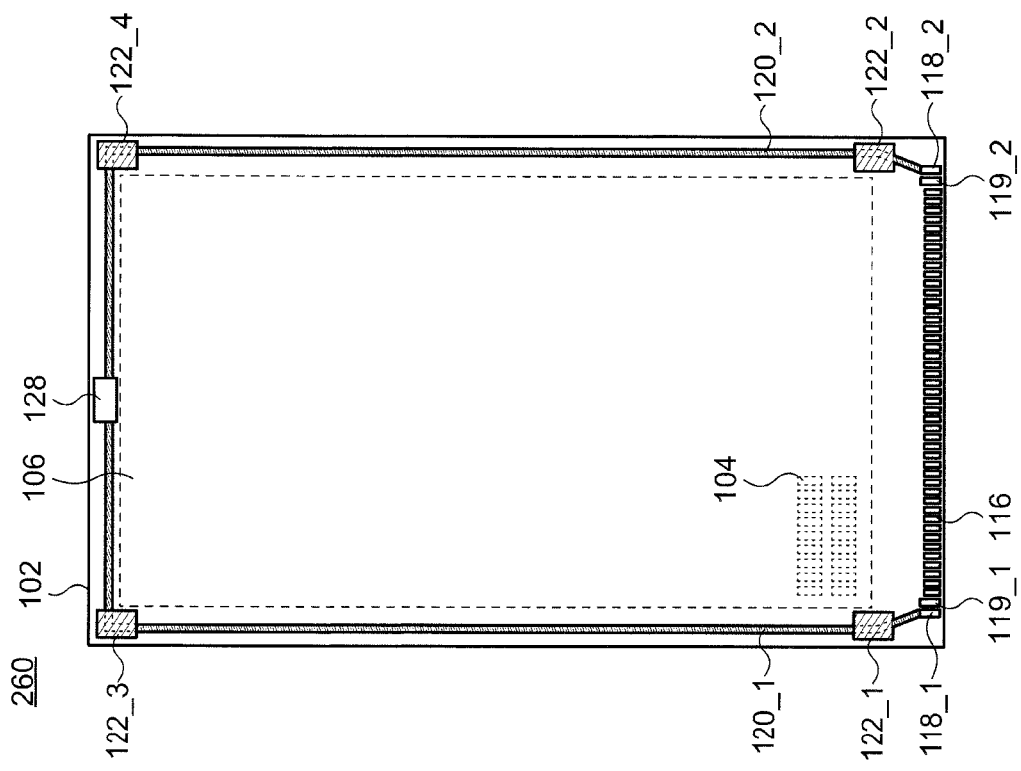

The number of the switch 128 is not limited to one. For example, the display device 270 shown in FIG. 13B possesses a switch 128_1 provided between the first contact electrode 122_1 and the third contact electrode 122_3 and a switch 128_3 provided between the second contact electrode 122_2 and the fourth contact electrode 122_4 in addition to a switch 128_2 connecting the first wiring 120_1 to the second wiring 120_2. The switch 128_1 controls connection and disconnection of the first wiring 120_1 between the first contact electrode 122_1 and the third contact electrode 122_3. The switch 128_3 controls connection and disconnection of the second wiring 120_2 between the second contact electrode 122_2 and the fourth contact electrode 122_4. In the display device 270 with such a structure, it is possible to obtain the resistivity reflected by the thicknesses of the opposing electrode 124 in the three directions along arrows 272, 274, and 276 by turning on the switches 128_1 and 128_2 and turning off the switch 128_3, for example. Therefore, it is possible to obtain the averaged thickness of the whole of the opposing electrode 124 or a value close thereto.

When the switches 128_1 and 128_3 are turned on and the switch 128_2 is turned off, the display device 270 has the same structure as the display device 100, and information regarding the thickness of the opposing electrode 124 in the regions close to the two short sides of the substrate 102 can be obtained. On the other hand, when all of the switches 128_1 to 128_3 are turned off, it is possible to obtain information regarding the thickness of the opposing substrate 124 in the direction along the arrow 274 in the region close to the side on which the image-signal terminals 116 are arranged. As described above, the operation of the switches 128 allows various information such as a local thickness of the opposing electrode 124 and an averaged value of the thickness of the whole of the opposing electrode 124 to be extracted. Although the display devices according to the present embodiment have a structure in which the two power-source terminals 118 are connected via a layer other than the opposing electrode 124 similar to those disclosed in the aforementioned reference, the current flowing in this layer is inhibited by the switches 128. That is, it is possible to exclude the conductive route which does not include the opposing electrode 124 between the two power-source terminals 118 by turning off the switches 128. Therefore, the resistivity of the opposing electrode 124 is reflected in the resistivity between the power-source terminals 118 and can be measured by measuring the resistance between the two power-source terminals 118.

Fourth Embodiment

In the present embodiment, a display device 280 with a structure different from those of the display devices described in the First to Third Embodiments, a manufacturing method thereof, and a method for measuring the thickness of the opposing electrode 124 by using the display device 280 are explained. An explanation of the contents the same as or similar to those of the First to Third Embodiments may be omitted.

Figure 14A:
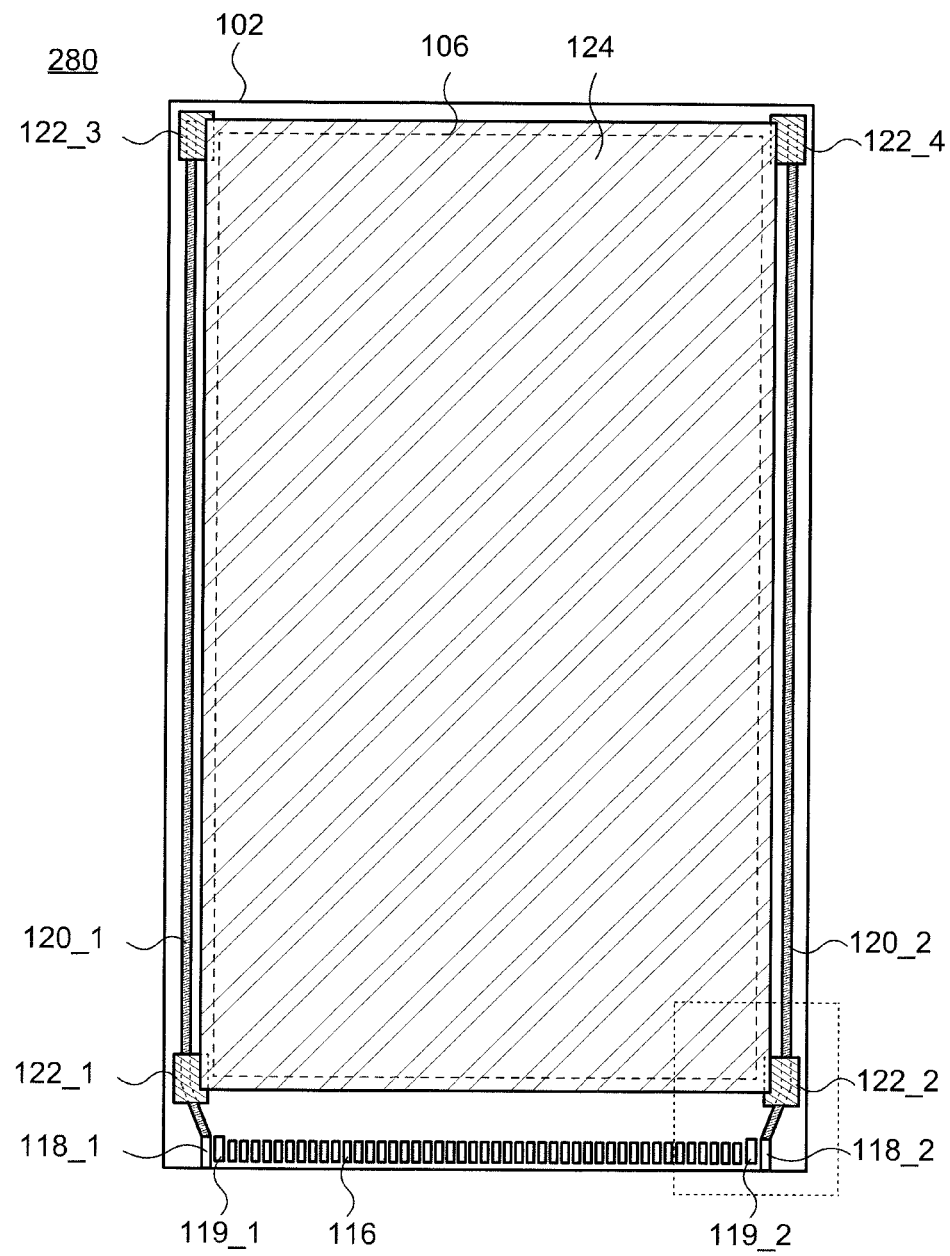
FIG. 14A to FIG. 14C are schematic top views of a display device according to an embodiment.
Figure 14B:
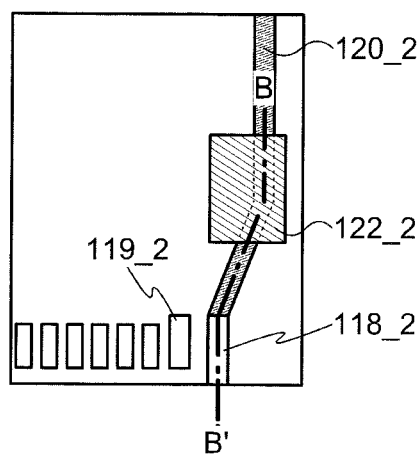
Figure 15:
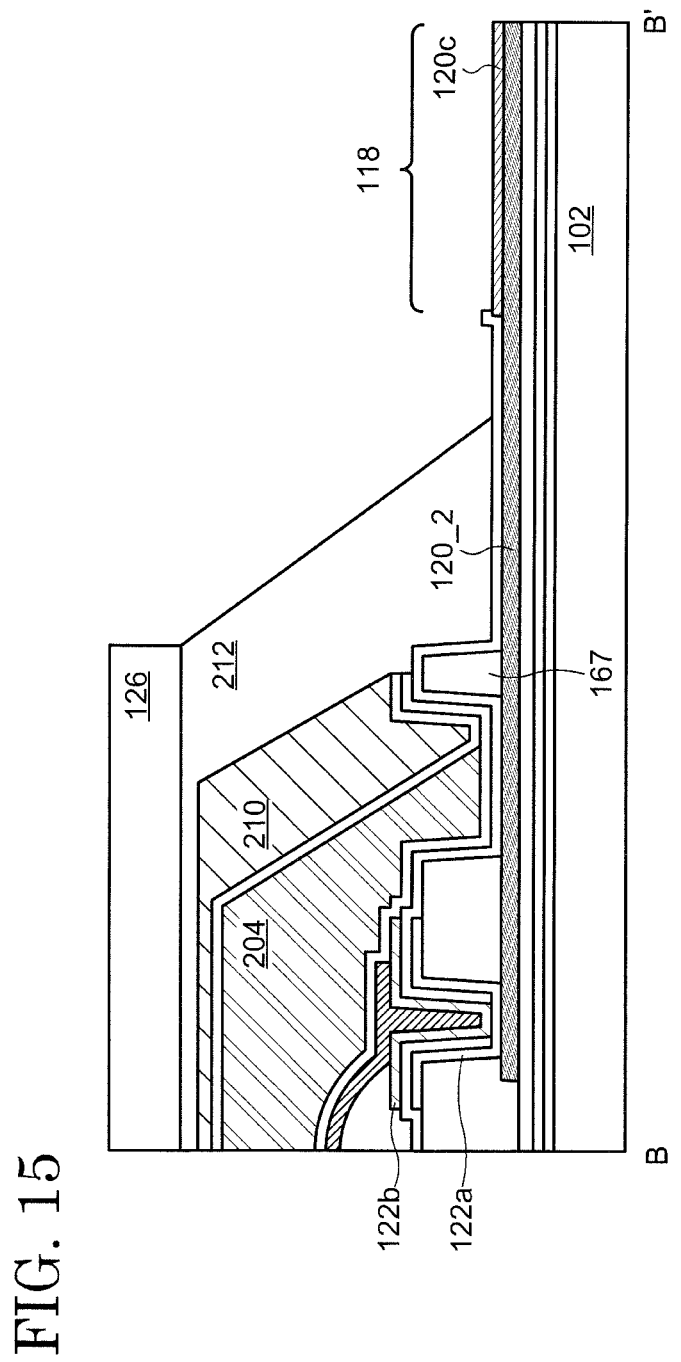
FIG. 15 is a schematic cross-sectional view for explaining a manufacturing method of a display device according to an embodiment.

As shown in FIG. 14A and its enlarged figure (FIG. 14B), the display device 280 is different from the display device 100 in that an edge portion of the power-source terminal 118 matches the edge portion of the substrate 102. More specifically, the edge portion of the power-source terminal 118 reaches the edge portion of the side of the substrate 102 close to the image-signal terminals 116 as shown in a schematic view of a cross section (FIG. 15) along a chain line B-B' in FIG. 14B. Therefore, a side surface of the wiring 120, a side surface of the protection electrode 122c, and a side surface of the substrate 102 can exist in the same plane.

Figure 16A:
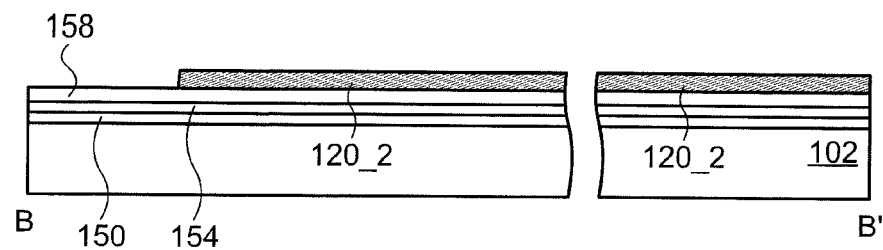
FIG. 16A to FIG. 16C are schematic cross-sectional views for explaining a manufacturing method of a display device according to an embodiment.

Manufacture of the display device 280 may be performed as follows. First, similar to the First Embodiment, the structures up to the wiring 120 are fabricated on the substrate 102 serving as a mother glass (FIG. 16A). At this time, the wiring 120 may be formed so that the edge portion of the substrate 102 matches the edge portion of the wiring 120 or may be formed so that, similar to the First Embodiment, the edge portion of the substrate 102 is spaced from the edge portion of the wiring 120 (see FIG. 7B).

Figure 16B:
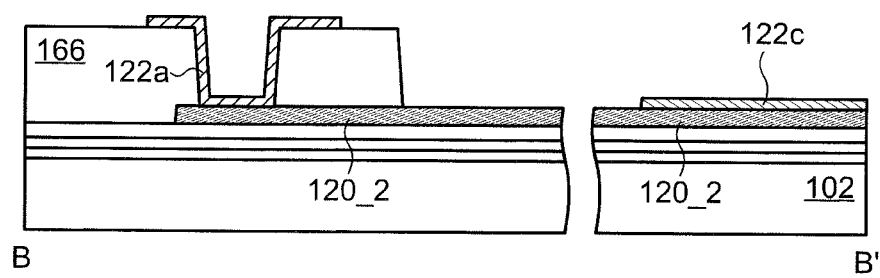

Next, the structures up to the lower electrode 122a and the protection electrode 122c are formed similar to the First Embodiment (FIG. 16B). The protection electrode 122c may be formed so that an edge portion thereof matches the edge portion of the substrate 102 or may be formed so that, similar to the First Embodiment, the edge portion of the protection electrode 122c is spaced from the edge portion of the substrate 102 (see FIG. 8A).

Figure 16C:
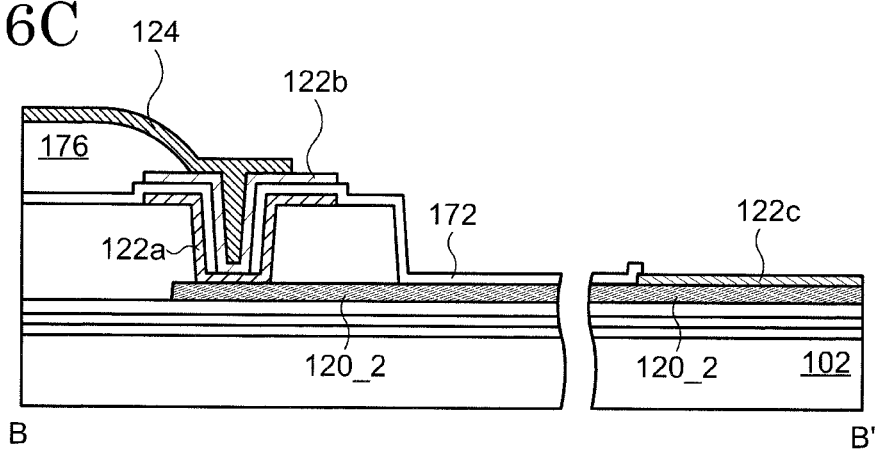
Figure 17A:
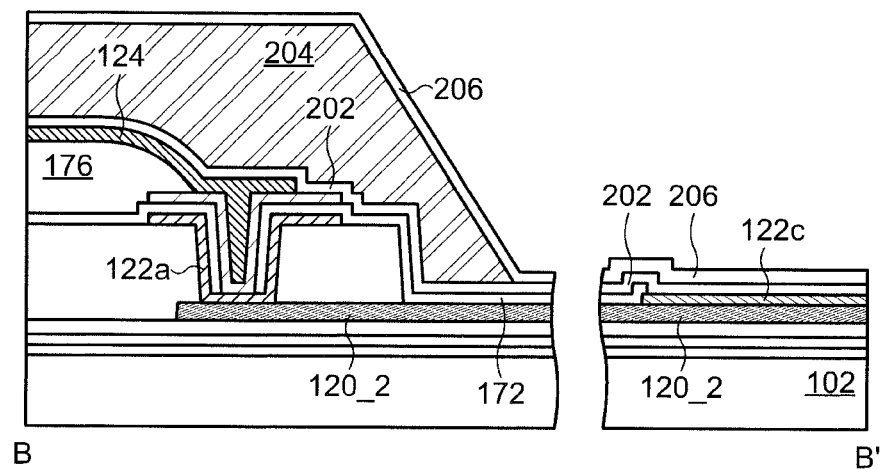
FIG. 17A and FIG. 17B are schematic cross-sectional views for explaining a manufacturing method of a display device according to an embodiment.
Figure 17B:
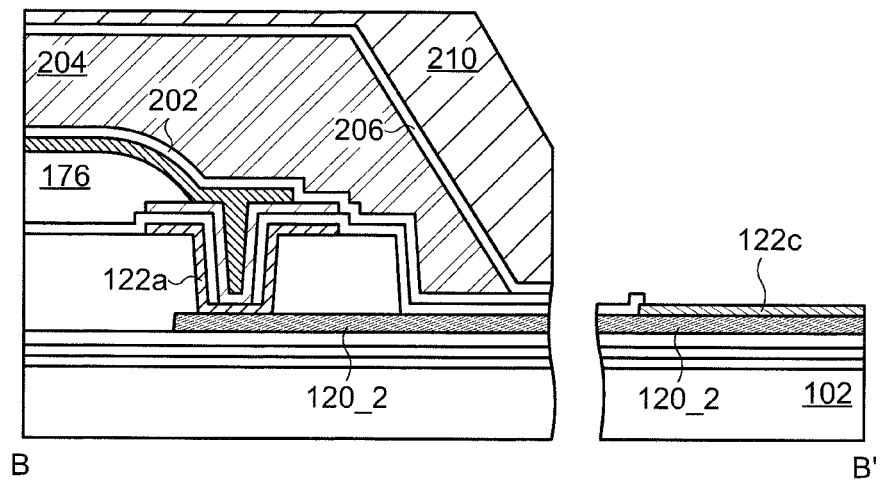

After that, the insulating film 172 is formed to determine a position of the edge portion of the power-source terminal 118 on a side close to the display region 106 (FIG. 16C). Next, the structures up to the opposing electrode 124 are formed, the passivation film 200 is arranged (FIG. 17A), and the protection electrode 122c is exposed by partly removing the first layer 202 and the second layer 206 formed over the protection electrode 122c by utilizing the resin film 210 (FIG. 17B).

After that, the resistance is measured. The measurement is carried out similar to the First Embodiment, and the conditions for forming the opposing electrode 124 are adjusted if necessary.

Figure 18A:
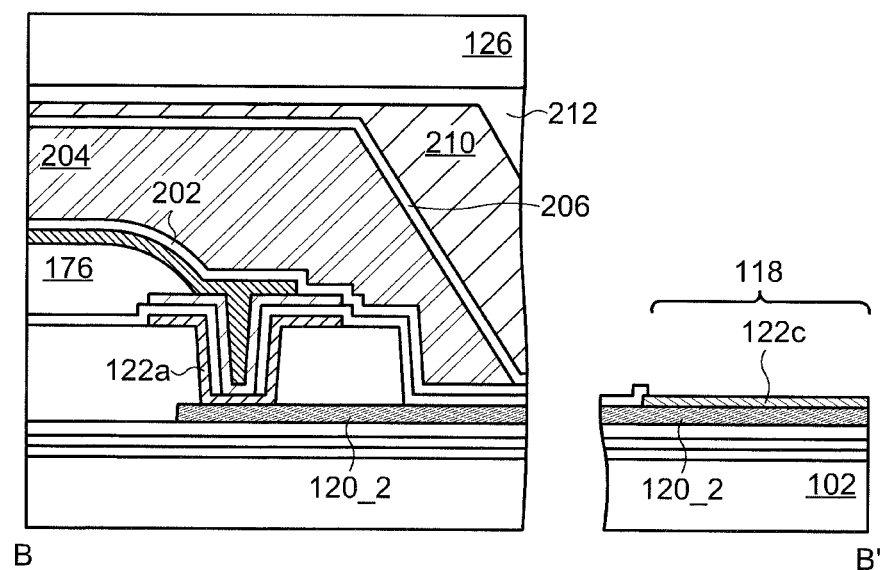
FIG. 18A and FIG. 18B are respectively a schematic cross-sectional view and top view for explaining a manufacturing method of a display device according to an embodiment.
Figure 18B:
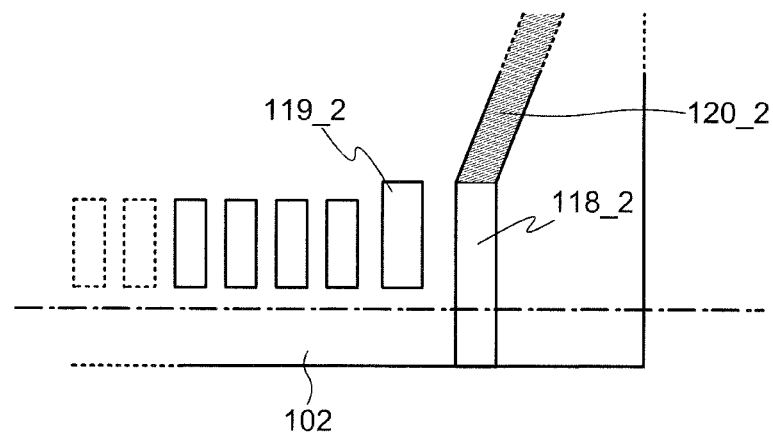
Figure 19A:
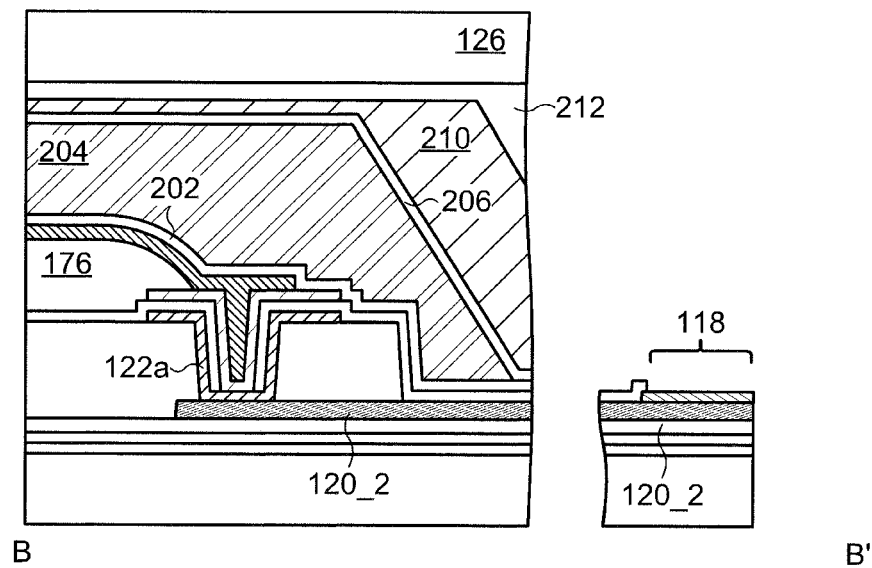
FIG. 19A and FIG. 19B are respectively a schematic cross-sectional view and top view for explaining a manufacturing method of a display device according to an embodiment.
Figure 19B:
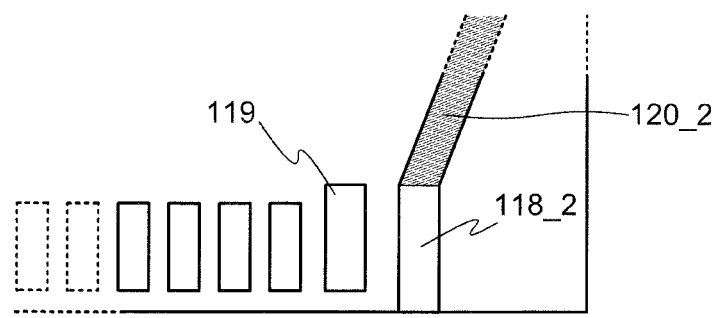

After that, the opposing substrate 126 is fixed with the adhesive layer 212 as shown in FIG. 18A. A schematic top view in this state is shown in FIG. 18B. After that, the substrate 102 is divided along a chain line shown in FIG. 18B. That is, the substrate 102 is simultaneously divided when the wiring 120 and the protection electrode 122c are divided (FIG. 19A), which is accompanied by a reduction of the area of the power-source terminal 118 prior to the division (FIG. 19B). The opposing substrate 126 is also divided so as to expose the power-source terminal 118 from the opposing substrate 126, by which the individual display devices 100 are obtained.

Figure 14C:
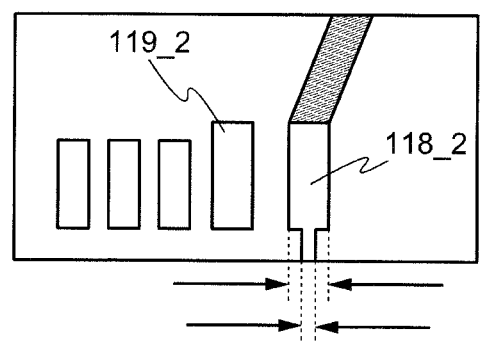

According to the manufacturing method of the display device 100 described in the present embodiment, the resistance is measured by using the power-source terminal 118 before dividing the wiring 120 and the protection electrode 122c. Hence, the power-source terminal 118 with a wide area can be supplied for the resistance measurement, by which the resistance can be readily measured more correctly with high reproducibility. Note that, as shown in FIG. 14C, a width of the power-source terminal 118 on a side of the edge portion of the substrate 102 may be smaller than that on a side close to the display region 106. In this case, the substrate 102 is divided so that a region with a narrow width is divided, which allows the substrate 102 to be more readily divided.

Fifth Embodiment

In the present embodiment, a display device 290 with a structure different from that of the display devices described in the First to Fourth Embodiments and a manufacture-managing method using the display device 290 are explained. An explanation of the contents the same as or similar to those of the First to Fourth Embodiments may be omitted.

Figure 20A:
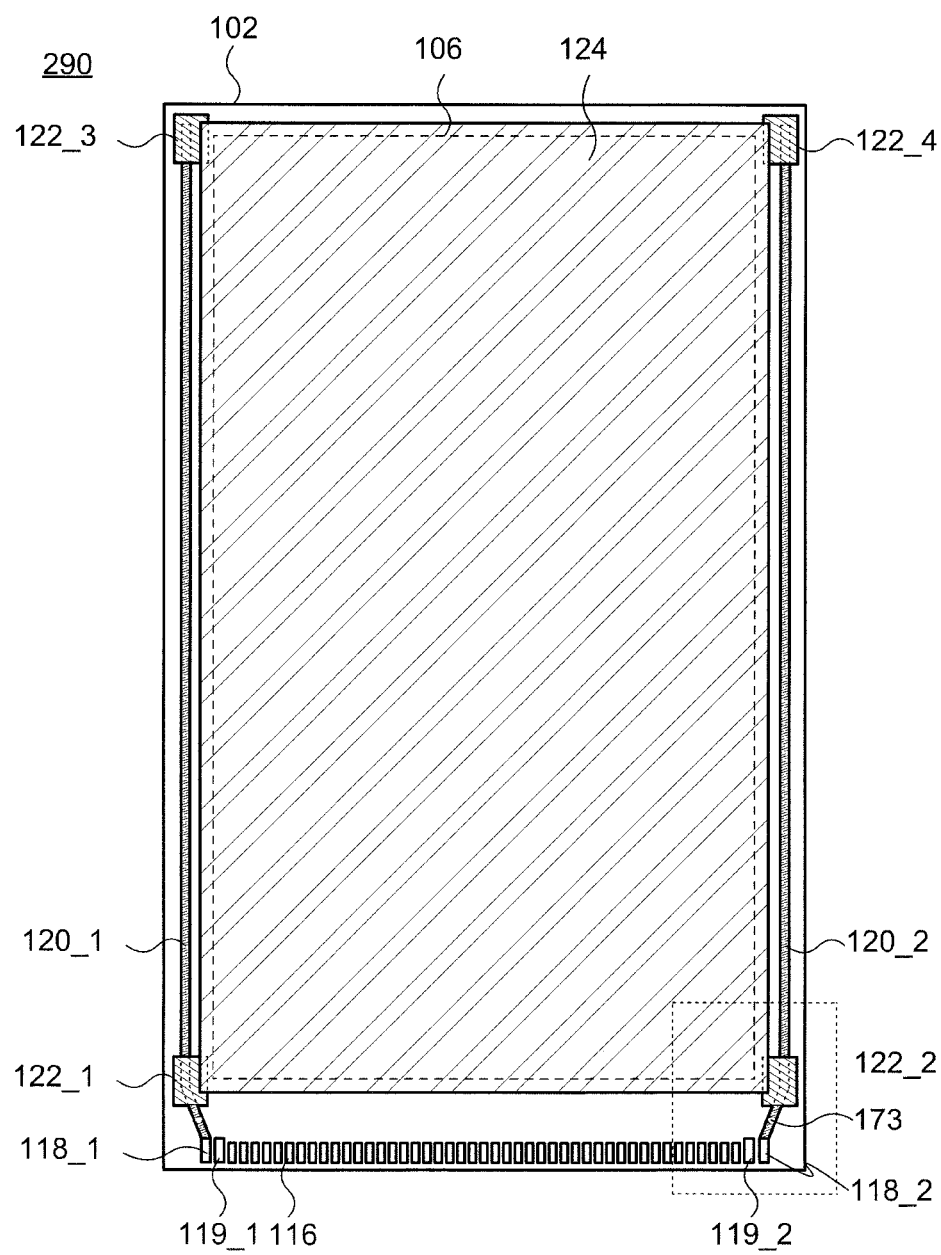
FIG. 20A and FIG. 20B are schematic top views of a display device according to an embodiment.
Figure 20B:
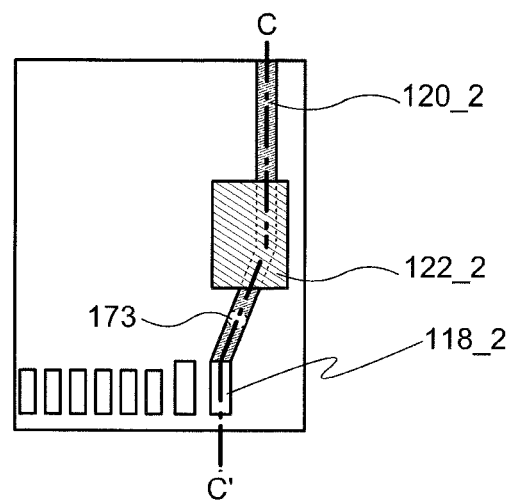
Figure 21:
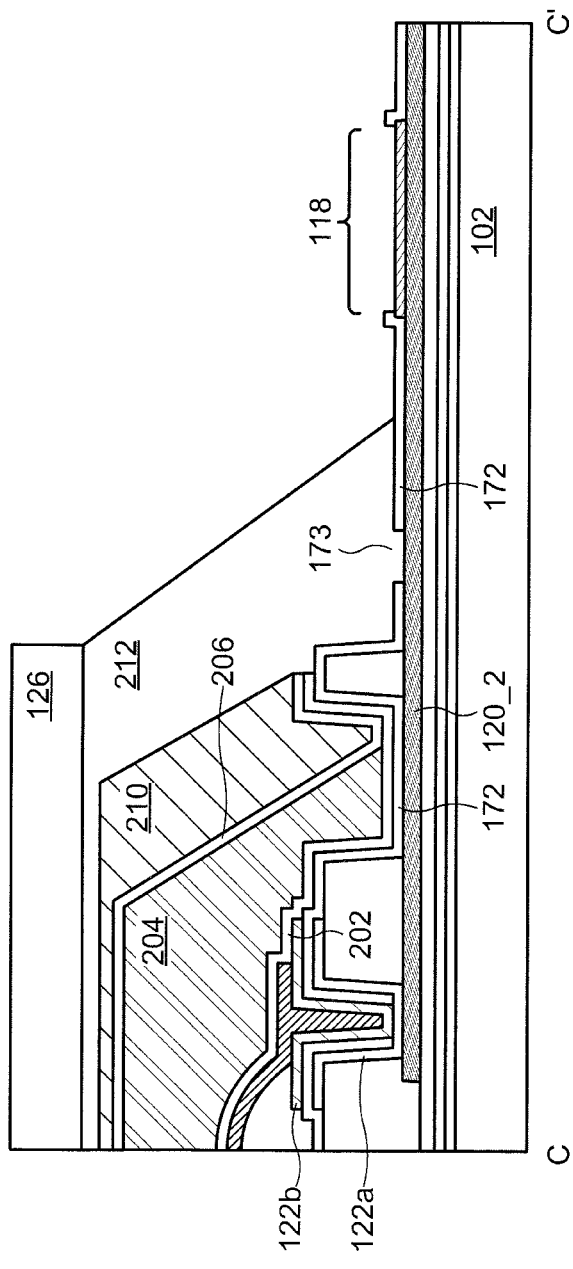
FIG. 21 is a schematic cross-sectional view of a display device according to an embodiment.

As shown in FIG. 20A and its enlarged figure (FIG. 20B), the display device 290 is different from the display device 100 in that the display device 290 has an opening 173 located in the insulating film 172 and overlapping with the wiring 120. The resistance measurement can be performed by utilizing this opening in the display device 290. More specifically, as shown in a schematic view of a cross section along a chain line C-C' in FIG. 20B (FIG. 21), the insulating film 172 has the opening 173 overlapping with the wiring 120 between the power-source terminal 118 and the contact electrode 122, and the wiring 120 is in contact with the adhesive layer 212 in the opening 173.

In the display device 290 with such a structure, the display device 290 can be inspected by using the wiring 120 exposed in the opening 173 in addition to the power-source terminal 118. For example, the resistance measurement can be carried out while performing display inspection of the display device 100 by using the power-source terminal 118. Furthermore, unlike the measurement of the resistance by utilizing the power-source terminal 118, the influence of the protection electrode 122c can be excluded, which enables more precise measurement of resistance.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
a plurality of pixels arranged in a matrix form over a substrate and each comprising a pixel electrode;
a first wiring and a second wiring over the substrate and sandwiching the plurality of pixels;
a first contact electrode and a second contact electrode respectively covering at least a part of the first wiring and at least a part of the second wiring; and
an opposing electrode over and overlapping with the pixel electrodes, the first contact electrode, and the second contact electrode, the opposing electrode being shared by the plurality of pixels,
wherein the first wiring and the second wiring are spaced from each other and electrically connected to the opposing electrode through the first contact electrode and the second contact electrode, respectively, and
the display device has a conductive route on the substrate between the first wiring and the second wiring via the opposing electrode but does not have any other conductive route on the substrate between the first wiring and the second wiring.

2. The display device according to claim 1, further comprising:
a third contact electrode covering the first wiring and covered by the opposing electrode; and
a fourth contact electrode covering the second wiring and covered by the opposing electrode, wherein
the first wiring and the second wiring are electrically connected to the opposing electrode through the third contact electrode and the fourth contact electrode, respectively.

3. The display device according to claim 2, wherein
the opposing electrode is spaced from the first wiring and the second wiring in a region between the first contact electrode and the third contact electrode and a region between the second contact electrode and the fourth contact electrode.

4. The display device according to claim 1, wherein the plurality of pixels each comprise:
a transistor;
a leveling film over the transistor; and
an insulating film over the leveling film and under the pixel electrode, and each of the first contact electrode and the second contact electrode comprises:
a lower electrode; and
an upper electrode over and electrically connected to the lower electrode through the insulating film.

5. The display device according to claim 4, wherein
the upper electrode exists in the same layer as the pixel electrode.

6. The display device according to claim 4, wherein
the plurality of pixels each comprise a connection electrode electrically connecting the transistor to the pixel electrode, and
the lower electrode exists in the same layer as the connection electrode.

7. The display device according to claim 4, further comprising:
an opposing substrate over the plurality of pixels; and
an adhesive layer between the opposing electrode and the opposing substrate, wherein
the insulating film has an opening overlapping with the first wiring and the second wiring, and
the adhesive layer is in contact with the first wiring and the second wiring in the opening.

8. The display device according to claim 1, wherein
the first wiring and the second wiring each include a terminal configured to be electrically connected to a connector.

9. A display device comprising:
a plurality of pixels arranged in a matrix form over a substrate and each comprising a pixel electrode;
a first wiring and a second wiring over the substrate and sandwiching the plurality of pixels;
a first contact electrode and a second contact electrode respectively covering at least a part of the first wiring and at least a part of the second wiring; and
an opposing electrode over and overlapping with the pixel electrodes, the first contact electrode, and the second contact electrode, the opposing electrode being shared by the plurality of pixels, wherein
the first wiring and the second wiring are spaced from each other and electrically connected to the opposing electrode through the first contact electrode and the second contact electrode,
the display device has a first conductive route on the substrate between the first wiring and the second wiring via the opposing electrode and a second conductive route on the substrate between the first wiring and the second wiring without via the opposing electrode,
a switch configured to select whether or not the first wiring and the second wiring are conducted with each other is provided between the first wiring and the second wiring on the second conductive route, and
the display device does not have any other conductive route on the substrate between the first wiring and the second wiring without via the opposing electrode other than the second conductive route.

10. The display device according to claim 9, further comprising:
a third contact electrode covering the first wiring and covered by the opposing electrode; and
a fourth contact electrode covering the second wiring and covered by the opposing electrode, wherein
the first wiring and the second wiring are electrically connected to the opposing electrode through the third contact electrode and the fourth contact electrode, respectively.

11. The display device according to claim 10, wherein
the opposing electrode is spaced from the first wiring and the second wiring in a region between the first contact electrode and the third contact electrode and a region between the second contact electrode and the fourth contact electrode.

12. The display device according to claim 9, wherein
the plurality of pixels each comprise:
a transistor;
a leveling film over the transistor; and
an insulating film over the leveling film and under the pixel electrode, and each of the first contact electrode and the second contact electrode comprises:
a lower electrode; and
an upper electrode over and electrically connected to the lower electrode through the insulating film.

13. The display device according to claim 12, wherein
the upper electrode exists in the same layer as the pixel electrode.

14. The display device according to claim 12, wherein
the plurality of pixels each comprise a connection electrode electrically connecting the transistor to the pixel electrode, and
the lower electrode exists in the same layer as the connection electrode.

15. The display device according to claim 12, further comprising:
an opposing substrate over the plurality of pixels; and
an adhesive layer between the opposing electrode and the opposing substrate, wherein
the insulating film has an opening overlapping with the first wiring and the second wiring, and
the adhesive layer is in contact with the first wiring and the second wiring in the opening.

16. The display device according to claim 9, wherein
the first wiring and the second wiring each include a terminal configured to be electrically connected to a connector.

* * * * *